United States Patent
Chacon et al.

(10) Patent No.: US 9,528,812 B2
(45) Date of Patent: *Dec. 27, 2016

(54) CAPACITIVE WIRE SENSING FOR FURNITURE

(71) Applicant: L & P PROPERTY MANAGEMENT COMPANY, South Gate, CA (US)

(72) Inventors: Ryan Edward Chacon, Carthage, MO (US); Avinash Madadi, Webb City, MO (US); William Rohr, Joplin, MO (US); Sam Cassell, Chetopa, KS (US)

(73) Assignee: L&P Property Management Company, South Gate, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/749,120

(22) Filed: Jan. 24, 2013

(65) Prior Publication Data
US 2013/0174343 A1 Jul. 11, 2013

Related U.S. Application Data

(63) Continuation-in-part of application No. 13/346,386, filed on Jan. 9, 2012, now Pat. No. 9,337,831.

(51) Int. Cl.
G01R 27/26 (2006.01)
G01B 7/00 (2006.01)
(Continued)

(52) U.S. Cl.
CPC .............. *G01B 7/003* (2013.01); *A47C 20/041* (2013.01); *A47C 20/08* (2013.01); *A47C 21/00* (2013.01);
(Continued)

(58) Field of Classification Search
CPC ... G01N 27/221; G01R 27/2605; G01R 27/26; A61B 5/6892; A61B 5/11; A61B 2562/0214; A61B 5/1115; G08B 21/22; H03K 17/955; A47C 21/00; A47C 20/08; G06Q 50/24; G01B 7/003
(Continued)

(56) References Cited

U.S. PATENT DOCUMENTS 3,372,319 A 3/1968 Rhodes
3,971,371 A 7/1976 Bloom
(Continued)

FOREIGN PATENT DOCUMENTS

DE 102007018694 A1 11/2008
EP 1275328 A1 1/2003
(Continued)

OTHER PUBLICATIONS

International Search Report with Written Opinion dated Aug. 29, 2014 in Application No. PCTUS1432555, 8 pages.
(Continued)

*Primary Examiner* — Amy He
(74) *Attorney, Agent, or Firm* — Shook, Hardy & Bacon, L.L.P.

(57) ABSTRACT

A system and method for incorporating presence-sensing technology into furniture is provided. More particularly, the invention relates to detecting presence using a metal, adjustable bed frame. The bed frame is pulsed with a voltage to provide a charge, against which capacitance is measured. A controller determines the corresponding response based on presence detection by the frame. Conductive bushings may also be used to measure capacitance using the bed frame. In further embodiments, capacitance is measured by a foil tape surrounding a perimeter of the adjustable bed. The foil tape has a voltage based on proximity of an object to the tape, and may be embedded with a capacitive wire. A processor receives information regarding changes in capacitance and determines when a change in voltage satisfies a threshold.

(Continued)

Based on a determination of presence, or lack of presence, a variety of corresponding features of the adjustable bed may be activated.

17 Claims, 12 Drawing Sheets

(51) Int. Cl.
| | |
|---|---|
| *A47C 21/00* | (2006.01) |
| *G01V 3/08* | (2006.01) |
| *H03K 17/955* | (2006.01) |
| *A47C 20/04* | (2006.01) |
| *A47C 20/08* | (2006.01) |
| *H03K 17/96* | (2006.01) |

(52) U.S. Cl.
CPC ........... *G01R 27/2605* (2013.01); *G01V 3/088* (2013.01); *H03K 17/955* (2013.01); *H03K 2017/9602* (2013.01); *H03K 2217/96078* (2013.01)

(58) Field of Classification Search
USPC .......................................... 324/663, 686, 658
See application file for complete search history.

(56) References Cited

U.S. PATENT DOCUMENTS

| | | | |
|---|---|---|---|
| 3,991,746 A | 11/1976 | Hanna et al. | |
| 5,235,319 A | 8/1993 | Hill | |
| 5,260,666 A | 11/1993 | Dishman et al. | |
| 5,481,769 A | 1/1996 | Schneider | |
| 6,025,782 A * | 2/2000 | Newham | 340/573.1 |
| 6,067,019 A * | 5/2000 | Scott | 340/573.4 |
| 6,768,420 B2 | 7/2004 | McCarthy et al. | |
| 8,397,324 B2 * | 3/2013 | Hayes et al. | 5/618 |
| 8,427,450 B2 * | 4/2013 | Lin | 345/174 |
| 2002/0070866 A1 | 6/2002 | Newham | |
| 2003/0011225 A1 | 1/2003 | Barcesat | |
| 2005/0088264 A1 | 4/2005 | Iwasaki | |
| 2005/0231379 A1 | 10/2005 | Sprecher et al. | |
| 2006/0164254 A1 | 7/2006 | Kamizono et al. | |
| 2007/0040676 A1 | 2/2007 | Bandringa et al. | |
| 2009/0119841 A1 | 5/2009 | Takashima | |
| 2009/0211818 A1 | 8/2009 | Kondo | |
| 2010/0096899 A1 | 4/2010 | Kato et al. | |
| 2011/0209287 A1 | 9/2011 | Call et al. | |
| 2011/0221459 A1 | 9/2011 | Uno et al. | |
| 2012/0025991 A1 | 2/2012 | O'Keefe et al. | |
| 2013/0176040 A1 * | 7/2013 | Rohr et al. | 324/686 |
| 2013/0247302 A1 * | 9/2013 | Chacon et al. | 5/613 |

FOREIGN PATENT DOCUMENTS

| | | |
|---|---|---|
| SE | 519289 C2 | 2/2003 |
| WO | 9944179 A1 | 9/1999 |
| WO | 0211585 A1 | 2/2002 |

OTHER PUBLICATIONS

International Search Report with Written Opinion dated May 16, 2014 in Application No. PCT/US2014/12797, 13 pages.
Non-Final Office Action dated Jun. 19, 2014 in U.S. Appl. No. 13/346,386, 17 pages.
Non-Final Office Action dated Nov. 20, 2014 in U.S. Appl. No. 13/854,720, 12 pages.
Final Office Action dated Dec. 15, 2014 in U.S. Appl. No. 13/346,386, 21 pages.
Notice of Allowance dated Mar. 20, 2015 in U.S. Appl. No. 13/854,720, 8 pages.
Non-Final Office Action dated Apr. 29, 2015 in U.S. Appl. No. 13/346,386, 9 pages.
International Preliminary Report on Patentability dated Aug. 6, 2015 in Application No. PCT/US2014/012797, 7 pages.
Final Office Action dated Sep. 28, 2015 in U.S. Appl. No. 13/346,386, 9 pages.
International Preliminary Report on Patentability dated Oct. 15, 2015 in Application No. PCT/US14/32555, 7 pages.
Notice of Allowance dated Jan. 8, 2016 in U.S. Appl. No. 13/346,386, 10 pages.
Non-Final Office Action dated Jan. 14, 2016 in U.S. Appl. No. 14/608,170, 13 pages.
International Search Report with Written Opinion dated Jun. 10, 2016 in PCT Application No. PCT/US2016/015358, 11 pages.
European Search Report dated Aug. 9, 2016 in European Patent Application No. 14743295.9, 7 pages.
Final Office Action dated May 31, 2016 in U.S. Appl. No. 14/608,170, 14 pages.
Notice of Allowance dated Jun. 15, 2016 in U.S. Appl. No. 4/608,173, 9 pages.
Notice of Allowance dated Jul. 21, 2016 in U.S. Appl. No. 14/608,170, 5 pages.
European Search Report dated Oct. 14, 2016 in European Patent Application No. 14779641.1, 8 pages.
International Search Report with Written Opinion dated Oct. 19, 2016 in PCT Application No. PCT/US2016/42900, 11 pages.

\* cited by examiner

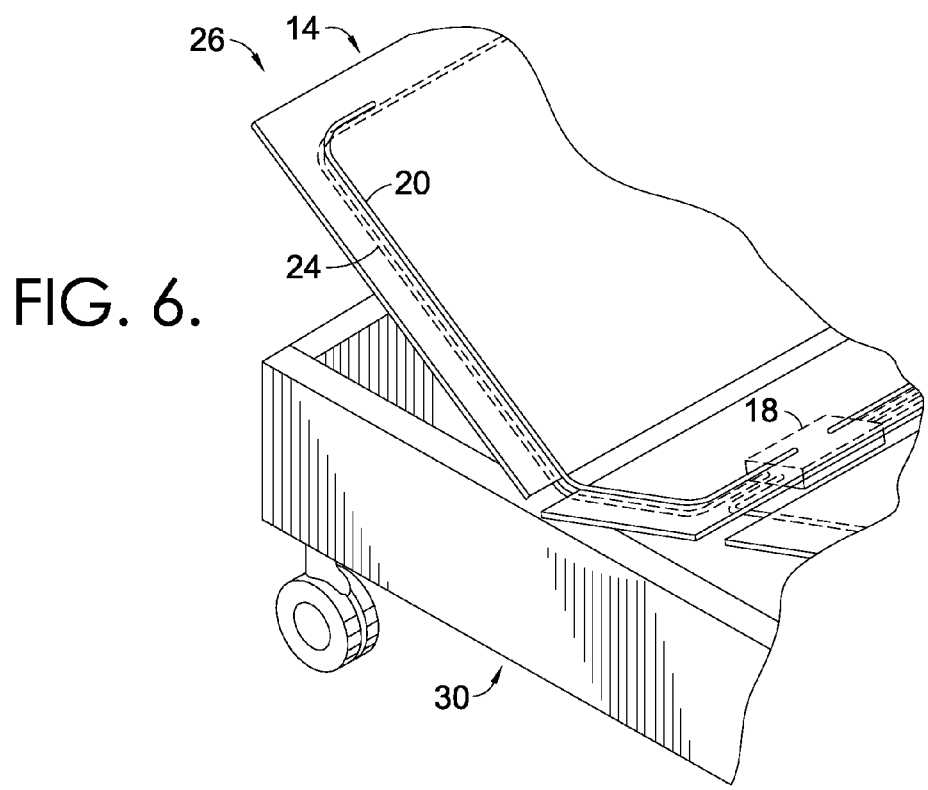
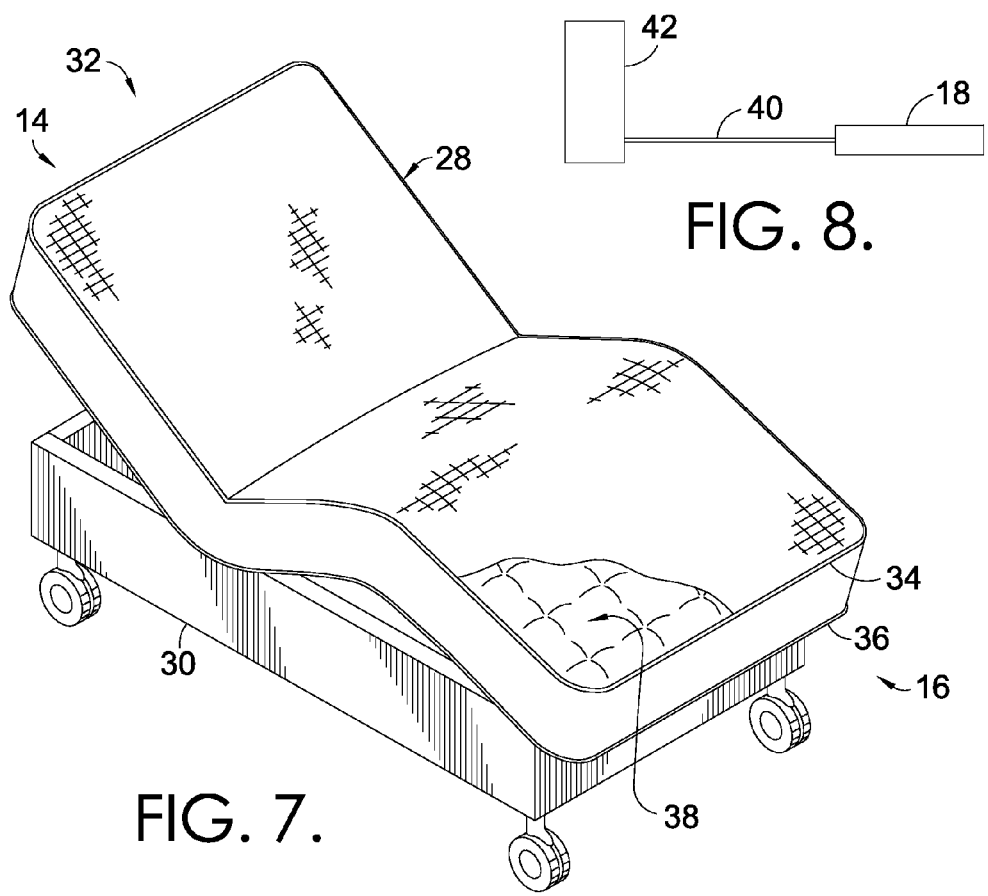

CAPACITIVE WIRE SENSING FOR FURNITURE

CROSS-REFERENCE TO RELATED APPLICATIONS

This application is a continuation-in-part of U.S. Nonprovisional application Ser. No. 13/346,386, filed Jan. 9, 2012, entitled "Capacitive Wire Sensing for Furniture," which is hereby incorporated by reference in its entirety.

STATEMENT REGARDING FEDERALLY SPONSORED RESEARCH OR DEVELOPMENT

Not applicable.

TECHNICAL FIELD

The present invention generally relates to presence-sensing technology incorporated into furniture. More particularly, the invention relates to incorporating a conductive medium into the periphery of a furniture item, such as a bed, for detecting the presence of a user or other body.

BACKGROUND OF THE INVENTION

A variety of features may be integrated into automated furniture items, including those designed to raise, lower, and generally conform to the comfort specifications of a user. Such automation may also include enhanced features that detect the presence of a person or other body, and elicit the corresponding automated response, such as stopping bed articulation or operating lighting in response to presence detection. For example, presence-sensing technology may be used to stop bed articulation to prevent an unintentional "pinch point," if the automated bedding system would otherwise be unaware of a person's presence.

Traditional presence-sensing technology for automated bedding systems utilize sensing or switches routed around the perimeter of a mattress. However, such switches can be expensive or impractical from a manufacturing standpoint. For example, presence-sensing switches may shift or bend during bed articulation, causing inaccurate readings and misplacement of the sensors. In applying upholstery to furniture items, a switch may already be compressed if the upholstery is pulled too tight. Pressure pads and switches may also be problematic in presence detection when a switch fails to be triggered by a person's presence. Alternatively, the same switches may be too sensitive, and activate independently from a body's presence. Additional analog components are required for presence detection in traditional technologies, using sensors/oscillators in addition to a circuit that detects a change.

Accordingly, a need exists for a reliable presence-sensing technology for use with furniture, such as an automated bedding system, which addresses the foregoing and other problems.

BRIEF SUMMARY OF THE INVENTION

The present invention generally relates to an apparatus for presence detection that incorporates a capacitive component into furniture items, including automated bedding systems. It should be understood that the invention contemplates incorporating a capacitive component, such as a capacitive wire, into a variety of furniture items, both bedding and otherwise, and that the invention is not limited to the specific item for which presence detection is provided. Additionally, the present invention is described as detecting/sensing presence of a person or other being using exemplary components such as a capacitive component, capacitive wire, segments of a capacitive wire, and a processor. Although a final determination of presence may be conducted using a processor and/or software associated with the claimed apparatus, reference to sensing and/or detection "by" the capacitive component, or a determination thereof by the processor, is not meant to be limiting. For example, a conductive signal detected by capacitive wires may be processed by software associated with a processor in a control enclosure, and such processing may result in a final determination of presence. In other words, a conductive wire could be described as having "detected" presence, even though the detection determination was ultimately made in software associated with a processor.

In one embodiment, a capacitive component is secured around the perimeter of a platform of an adjustable bed. For example, a capacitive wire may be secured to a perimeter of a top and bottom surface of a platform of an adjustable bed. In another embodiment, a capacitive wire is incorporated inside the tape edge applied to the perimeter of a mattress cover. In a further embodiment, capacitive wiring is integrated into the frame supporting an automated bedding system. A capacitive wire thread may also be woven into a pattern in a quilted mattress covering, in some embodiments. In further embodiments, a metal adjustable bed frame may be pulsed with a charge and used to monitor a change in capacitance based on contact with the metal frame. Exemplary embodiments of the invention include a control enclosure coupled to the capacitive component (such as a capacitive wire/thread/metal frame) that is associated with a processor that receives presence-detecting data via the capacitive component. Software associated with the control enclosure and the capacitive wires/threads/metal frames may then make a determination of presence of a body with respect to a bedding system. Based on a determination of presence, or lack thereof, a corresponding feature of the automated bedding system may be activated.

One illustrative embodiment of an adjustable bed comprises a mattress support that comprises a plurality of support panels. At least one of the support panels is movable relative to the other ones of said support panels to thereby adjust the bed. The adjustable bed further comprises a mattress resting on top of the mattress support, where the mattress has a covering material disposed over at least a top surface of the mattress, and at least one capacitive component coupled to the bed. The capacitive component is adapted to have a voltage based on the proximity of an object to the capacitive component. The adjustable bed further comprises a processor coupled to the capacitive component, and the processor is adapted to receive information provided by the capacitive component and to determine that a change in voltage satisfies a threshold.

In another illustrative aspect, the present invention includes a method for detecting presence with respect to a bed. The method includes receiving information provided by at least one capacitive component coupled to a perimeter of the bed, wherein the capacitive component is adapted to have a voltage based on the proximity of an object to the capacitive component; determining that a change in voltage satisfies a threshold amount; and based on determining that the threshold amount is satisfied, initiating a corresponding response.

According to a third illustrative aspect, the present invention includes a bed comprising a mattress having a covering material disposed over at least a top surface of the mattress, and a tape edge surrounding a perimeter of the top surface of the mattress, the tape edge coupled to the covering material. The bed further comprises at least one capacitive component coupled to at least a portion of the tape edge, wherein the capacitive component is adapted to have a voltage based on the proximity of an object to the capacitive component. The bed still further comprises a processor coupled to the capacitive component, the processor being adapted to receive information provided by the capacitive component and to determine that a change in voltage satisfies a threshold.

In a further illustrative embodiment, an adjustable bed comprises: a mattress support that comprises a plurality of support panels, at least one of said support panels movable relative to the other ones of said support panels to thereby adjust the bed; a mattress resting on top of the mattress support, said mattress having a covering material disposed over at least a top surface of the mattress; at least one capacitive component coupled to the bed, wherein the at least one capacitive component is adapted to have a voltage based on proximity of an object to the at least one capacitive component, and further wherein the at least one capacitive component comprises a metal frame associated with the adjustable bed; and a processor coupled to the at least one capacitive component, the processor adapted to receive information provided by the at least one capacitive component and to determine that a change in voltage satisfies a threshold.

In another embodiment, a method for detecting presence with respect to an adjustable bed comprises: receiving information provided by at least one capacitive component coupled to the adjustable bed, wherein the at least one capacitive component comprises a metal frame associated with the adjustable bed, wherein receiving information comprises pulsing the metal frame of the adjustable bed with a voltage to provide a charge to the metal frame, and further wherein the at least one capacitive component is adapted to have a voltage based on proximity of an object to the at least one capacitive component; and determining that a change in voltage satisfies a threshold, wherein determining that a change in voltage satisfies a threshold comprises: (1) monitoring a change in voltage detected by the at least one capacitive component over a particular period of time; and (2) comparing the change in voltage over the period of time with the threshold.

In a final illustrative embodiment, a method for detecting presence with respect to an adjustable bed comprises: receiving information provided by at least one capacitive component coupled to a perimeter of the adjustable bed, wherein the at least one capacitive component is adapted to have a voltage based on proximity of an object to the at least one capacitive component, and further wherein the at least one capacitive component comprises a foil tape; determining that a change in voltage satisfies a threshold amount; and based on determining that the threshold amount is satisfied, initiating a corresponding response.

Additional objects, advantages, and novel features of the invention will be set forth in part in the description which follows, and in part will become apparent to those skilled in the art upon examination of the following, or may be learned by practice of the invention.

BRIEF DESCRIPTION OF SEVERAL VIEWS OF THE DRAWING

The present invention is described in detail below with reference to the attached drawing figures, wherein:

FIG. 6 is an enlarged, perspective view of the automated bed of FIG. 5, with a capacitive wire coupled to the top of the platform and hidden lines indicating the capacitive wire and control enclosure coupled to the bottom of the platform, in accordance with embodiments of the invention;

FIG. 7 is a perspective view of an automated bed with a capacitive wire incorporated into the tape edge of the mattress cover, in accordance with embodiments of the invention;

FIG. 8 is a side view of a capacitive wire coupled to a control enclosure and an inner spring of a mattress, in accordance with embodiments of the invention;

DETAILED DESCRIPTION OF THE INVENTION

Figure 1:
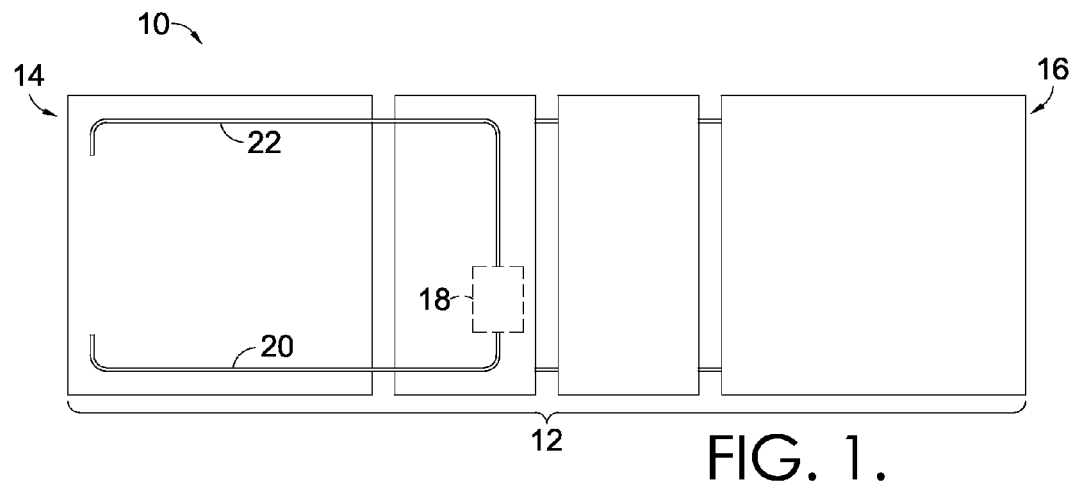
FIG. 1 is a top view of a capacitive wire coupled to the panels of an automated bed platform, in accordance with embodiments of the invention.

An embodiment of an automated bedding system 10 with capacitive wire sensing is seen in FIGS. 1-6. Referring first to FIG. 1, a top view of the platform of the automated bedding system 10 includes a plurality of panels 12 having a first end 14 and a second end 16, a control enclosure 18 (mounted below the panels 12), a first segment 20 of a capacitive wire, and a second segment 22 of a capacitive wire. In some embodiments, the first end 14 may be referred to as the "head" of the bed, while the second end 16 may be referred to as the "foot" of the bed.

When viewed from the top in FIG. 1, capacitive wiring is generally arranged near the first end 14 of the automated bedding system 10. A capacitive component, such as a capacitive wire, is adapted to have a voltage based on proximity of an object to the capacitive component. In some embodiments, the capacitive wire segments are standard conductive copper wires. The capacitance measured across such wires may be monitored by a processor that uses software to generate a determination of presence detection. In one embodiment, the Microchip® brand capacitive sensor may be used to determine when presence is detected. As such, while presence detection relies on the juxtaposition of a person or body with respect to the capacitive wiring, a determination of the level of detection or the measurement of presence is conducted digitally, in software associated with the processor.

As shown in FIG. 1, the capacitive wiring first and second segments 20 and 22 are coupled to the control enclosure 18, which is mounted below the panels 12 of the bedding system 10. In some embodiments, first and second segments 20 and 22 are made from a single capacitive wire, while in other embodiments, two separate capacitive wire segments 20 and 22 are coupled to the control enclosure 18. As will be understood, additional capacitive components, such as capacitive wire segments, may be coupled to the control enclosure 18, and arranged on the top of the plurality of panels 12. For example, additional capacitive wires arranged perpendicular to each other may be coupled to the control enclosure 18. In further embodiments, first and second segments 20 and 22 are made from a capacitive material other than wire.

Capacitive wire segments 20 and 22 may be used to detect presence or absence of a person or other being on top of the automated bedding system 10. For example, as arranged near first end 14 of the automated bedding system 10, the torso of a person positioned on the top of the automated bedding system 10 may be detected by capacitive wire segments 20 and 22. In embodiments, capacitive wire segments 20 and 22 create a defined sensing area on the top half of the head of the bedding system 10, and are less susceptible to noise interference from articulation of the rest of the automated bedding system 10.

Figure 2:
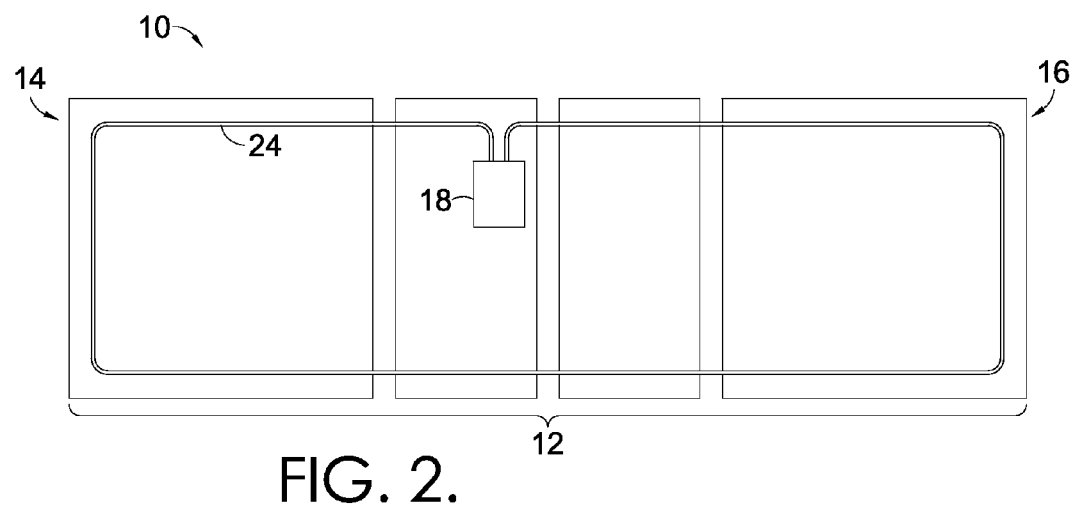
FIG. 2 is a bottom view of the automated bed platform of FIG. 1, with a capacitive wire and a control enclosure coupled to the panels, in accordance with embodiments of the invention.

Referring next to FIG. 2, a bottom view of the platform of the automated bedding system 10 includes the plurality of panels 12 having a first end 14 and a second end 16, a control enclosure 18, and a third segment 24 of capacitive wire. As shown in FIG. 2, the capacitive wiring third segment 24 is coupled to the control enclosure 18, which is mounted below the panels 12. In further embodiments, the control enclosure may be mounted in a different location on the bedding system 10, or may be external to the bedding system 10.

In some embodiments, third segment 24 is made from a single capacitive wire, while in other embodiments, multiple capacitive wire segments are coupled to the control enclosure 18. As will be understood, additional capacitive components, such as capacitive wire segments, may be coupled to the control enclosure 18, and arranged on the bottom of the plurality of panels 12. For example, additional capacitive wires arranged perpendicular to each other may be coupled to the control enclosure 18. In further embodiments, third segment 24 is made from a capacitive material other than wire.

Capacitive wire segment 24 may be used to detect presence or absence of a person or other being below the automated bedding system 10. For example, as arranged around the perimeter of the bed at both the first and second ends 14 and 16, a person or other body underneath the automated bedding system 10 may be detected by capacitive wire segment 24. In embodiments, based on detecting presence underneath the bedding system 10, bed articulation may be stopped. As viewed from the side in FIG. 3, the first and second segments 20 and 22 (hidden from view) create a defined sensing area on the top of the platform, near the first end 14, while the third segment 24 creates a defined sensing area on the bottom of the platform of the bedding system 10.

Figure 3:
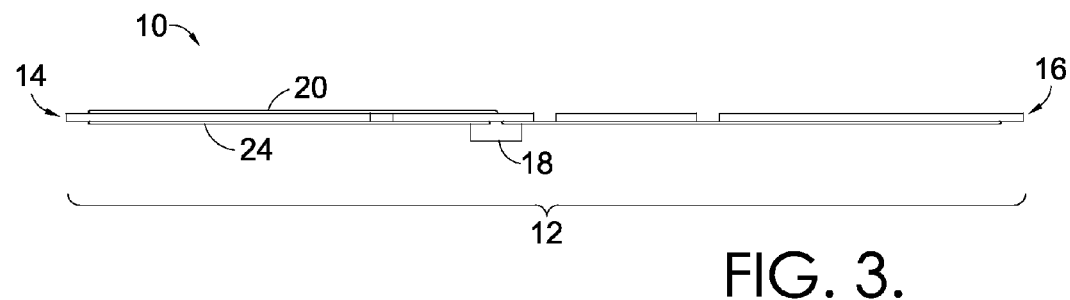
FIG. 3 is a side view of the automated bed platform of FIG. 1, with a capacitive wire coupled to the top and bottom of the platform, and the control enclosure coupled to the bottom of the platform, in accordance with embodiments of the invention.
Figure 4:
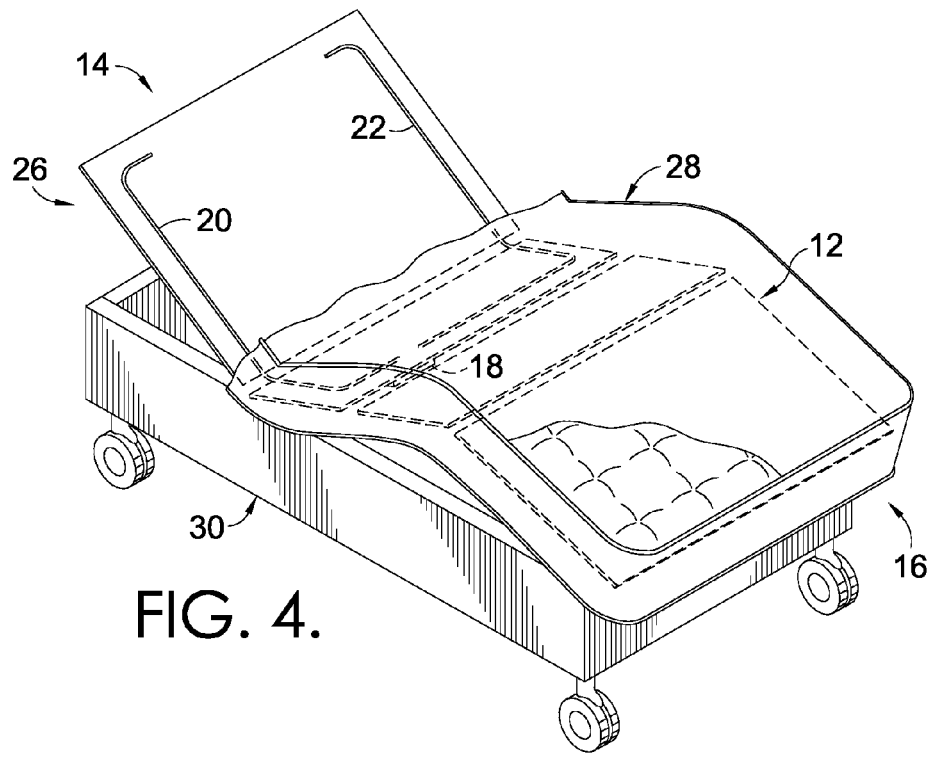
FIG. 4 is a perspective view of an automated bed with a portion of the mattress cut away to reveal the capacitive wire coupled to the top of the platform, in accordance with embodiments of the invention.

Referring next to FIG. 4, an adjustable bed 26 incorporates the automated bedding system 10 described with respect to FIGS. 1-3. The adjustable bed 26 includes a mattress 28 and a frame 30. A top portion of the mattress is cut away to reveal the first end 14 of the automated bedding system 10 platform, with the head of the bed partially raised. As described with reference to FIG. 1, capacitive wire segments 20 and 22 provide a defined sensing area near the first end 14, which detects a change in capacitance above the bed, such as the capacitance detected from a person resting on the bed.

Figure 5:
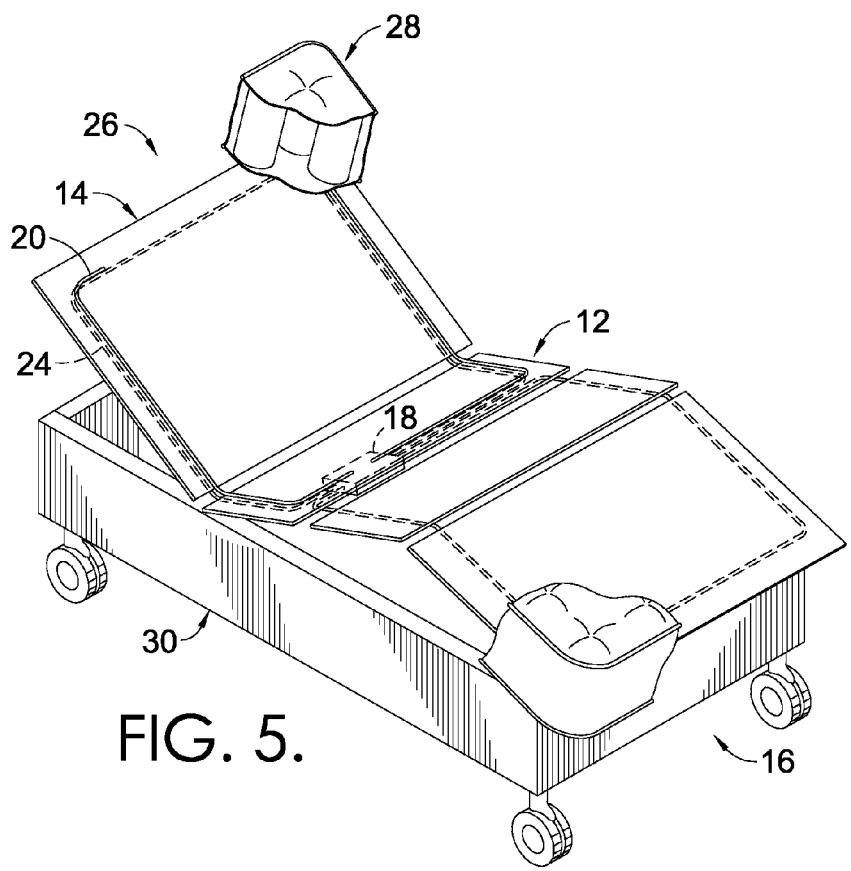
FIG. 5 is a perspective view of the automated bed of FIG. 4, with the mattress cut away to reveal the capacitive wire coupled to the top of the platform, and hidden lines indicating the capacitive wire and control enclosure coupled to the bottom of the platform, in accordance with embodiments of the invention.

FIG. 5 depicts the adjustable bed 26 from FIG. 4, with a majority of the mattress 28 removed. As can be seen on the plurality of panels 12, first and second segments 20 and 22 of capacitive wire detect presence above the platform (e.g. on top of the mattress), while the third segment 24 detects presence below the platform (e.g. under the bed). An enlarged view of FIG. 5 is shown in FIG. 6, with hidden lines depicting capacitive wires 20 and 24 coupled to the control enclosure 18, which is mounted beneath the panels 12.

In some embodiments, in alternative or in addition to positioning of capacitive wiring around the perimeter of the panels 12 that support an adjustable mattress, conductive wire is attached around the perimeter of the mattress itself. As shown in the adjustable bed 32 of FIG. 7, conductive wire may be incorporated into the tape edge surrounding the mattress 28. As such, the attached conductive wire may work as a sensor to detect presence of a person or other body near the perimeter of the mattress 28. For example, a conductive wire may be incorporated into the top tape edge 34 around the top surface of the mattress 28. In another example, a conductive wire may be incorporated into the bottom tape edge 36 around the bottom surface of the mattress 28. During manufacturing, a conductive wire may be inserted into the tape edge automatically, as the tape edge is applied to a mattress covering. In some embodiments, when routed through the tape edge perimeter, the sensitivity of the conductive wire may be adjusted in software associated with a processor used to determine presence detection.

The capacitive wire may be routed through some or all of the tape edge around the perimeter of a mattress 28. Additionally, a tape edge may be applied to both the top and bottom edges of the mattress 28, and both the top and bottom tape edges 34 and 36 may include a capacitive wire. Accordingly, the sensitivity of the capacitive wire in the top tape edge 34 may be adjusted independently from the tape edge 36 surrounding the perimeter of the bottom of the mattress. For example, a small change in voltage detected by the capacitive wires in the top tape edge 34 of the mattress may indicate that a user has moved on the surface of the mattress, but is still on the bed. By contrast, a small change in voltage detected by the capacitive wires in the bottom tape edge 36 of the mattress may indicate that a person, or other being, is below the bed. In either case, different features associated with the automated bedding system 10 may be activated based on whether presence is detected above the bed (via capacitive wires in the top tape edge 34) or below the bed (via capacitive wires in the bottom tape edge 36).

In further embodiments, a capacitive component may be incorporated into the mattress covering 38 of a mattress 28, as shown in FIG. 7. In particular, a capacitive thread may be sewn into the ticking on top of the mattress covering 38, as part of a sewn pattern. During manufacturing, a particular needle threaded with capacitive thread may be activated automatically and independently to incorporate the capacitive wire into a particular configuration on the surface of the mattress covering 38. For example, the capacitive thread may be sewn around a perimeter of the top surface of the mattress 28. In another example, the capacitive wire may be sewn in a pattern that creates perpendicular runs for capacitive detection. In one embodiment, capacitive thread sewn into the surface of a mattress covering 38 may terminate at a particular point and attach to a control enclosure 18. For example, an attachment may be used to crimp the mattress covering 38 material during sewing, to provide an attachment point for connecting the capacitive thread to a processor.

In some embodiments, a capacitive component may be incorporated into a platform-style bed. For example, a lower portion of a bed that does not articulate, such as a box spring or a mattress frame 30, may include a capacitive component that detects presence from above. In one embodiment, a capacitive wire is attached in a loop around the perimeter of the top of the frame 30, in FIG. 7. When a person or body is detected on top of the platform and/or frame 30, the articulating mattress 28 may discontinue lowering into contact with the frame 30. In one embodiment, a capacitive wire may be incorporated into the upholstery of a decorative surround (immovable frame). The sensitivity of the capacitive wire may be decreased so that direct contact is required with the edge of the surround before presence may be detected, in order to prevent false readings from a body approaching the frame and/or surround. In one embodiment, a decorative surround may include a conductive, metalized tape, such as an aluminum tape, that serves as a capacitive component for detecting presence with respect to the decorative surround. For example, a conductive metalized tape may be adhered to a perimeter of the decorative surround of an adjustable bed to determine presence near and/or on the bed, based on a change in capacitance detected by the metalized tape.

Presence may also be detected using a loop of capacitive wire incorporated inside a mattress. For example, as shown in FIG. 8, a fourth segment 40 of capacitive wire may be incorporated inside an inner spring 42, and coupled to the control enclosure 18. While only one inner spring 42 is shown, it should be understood that capacitive wire could be incorporated into one or more of the many innersprings that make up a traditional mattress. As such, the loop of capacitive wire can detect a person or object in proximity to the loop, such as a person on the mattress, above the loop of capacitive wire.

A defined sensing area is created by routing of a capacitive wire around a perimeter of a furniture item, in a variety of configurations such as those described above. For example, a capacitive wire routed around the perimeter of a mattress, such as in the tape edge around a perimeter of the top surface of a mattress, creates a defined sensing area on the area of the mattress surrounded by the sensing perimeter. As such, a person's presence within the sensing area may be detected by the capacitive wire, which a processor may use to determine when a person exits or enters a bed. A processor coupled to the capacitive component may be housed in a control enclosure, such as control enclosure 18. In one embodiment, the control enclosure 18 is mounted below the platform of an automated bedding system 10. In further embodiments, the control enclosure 18 is mounted generally beneath the mattress 28.

In embodiments, capacitive wire incorporated into the perimeter of a mattress is used to monitor a change in capacitance over a specified amount of time. The capacitive component (capacitive wire) is adapted to have a voltage based on proximity of an object to the capacitive component. Such voltage information is collected via the capacitive component and received by the processor, which determines when a change in voltage satisfies a threshold. Once a particular change in capacitance satisfies a threshold, a corresponding function associated with the automated bed may be initiated. In embodiments, a threshold for initiating a corresponding function includes a particular amount of change in voltage within a particular amount of time. For example, when using capacitance information to turn lights on/off, a particular amount of change in voltage may be required during a particular amount of time before satisfying the threshold indicating that a person has exited the bed (and before the lights may be turned on). Similarly, a particular threshold value of voltage change may be required by the processor, over a particular amount of time, before making a determination that a person has re-entered the bed (and before the lights can be turned off again). In embodiments, a processor continuously receives capacitance monitoring information, and monitors how quickly a change in capacitance occurs (how quickly the delta changes) to determine if a big enough change has occurred in a certain amount of time to satisfy a threshold, and trigger the corresponding function.

Based on satisfying a particular threshold, various features associated with the automated bedding system 10 may be activated and/or enabled. For example, an alarm clock may only be triggered if a person's presence is detected in the bed (i.e. if a threshold amount of change in voltage is detected during capacitance monitoring over a particular amount of time). In another example, additional bedding features may be activated based on presence detection by capacitive wires. Such additional integrated bedding features include having a massage motor activated to wake up a user. If a user is not present in the bed, and therefore not detected using the capacitive wires, the lack of presence detection will prevent the massage motor from running at a particular scheduled time.

A variety of other functions of the automated bedding system 10 may be controlled based on detection with a capacitive wire. In other words, a processor coupled to the capacitive wire may initiate a variety of functions based on received data indicating presence or lack of presence, as determined using capacitance information. Different functions may be controlled, such as stopping a bed from articulating when presence is detected beneath the bed, turning on/off lights based on a person exiting/entering a bed, and controlling other accessories or electrical/household appliances through internal circuitry associated with the processor. In one example, after presence is no longer detected in the bed (thereby indicating that a person has exited the bed) lights may be turned on. Additionally, when the person returns to the bed, the lights may turn off.

A variety of communication protocols may be used to control the variety of functions described above. For example, a two-way controller using ZigBee® wireless communication protocol may be used. In some embodiments, a two-way communication protocol intended for use in automation (similar to Bluetooth®) may be utilized. One embodiment of the invention may be controlled by an external sensor only, with all of the components necessary for the sensor that plug into an existing motor. In another embodiment, two separate microcontrollers may be used: one dedicated primarily for sensing purposes that, when it detects something, sends a signal to a secondary device/microcontroller that is programmed to initiate the corresponding response.

Figure 9:
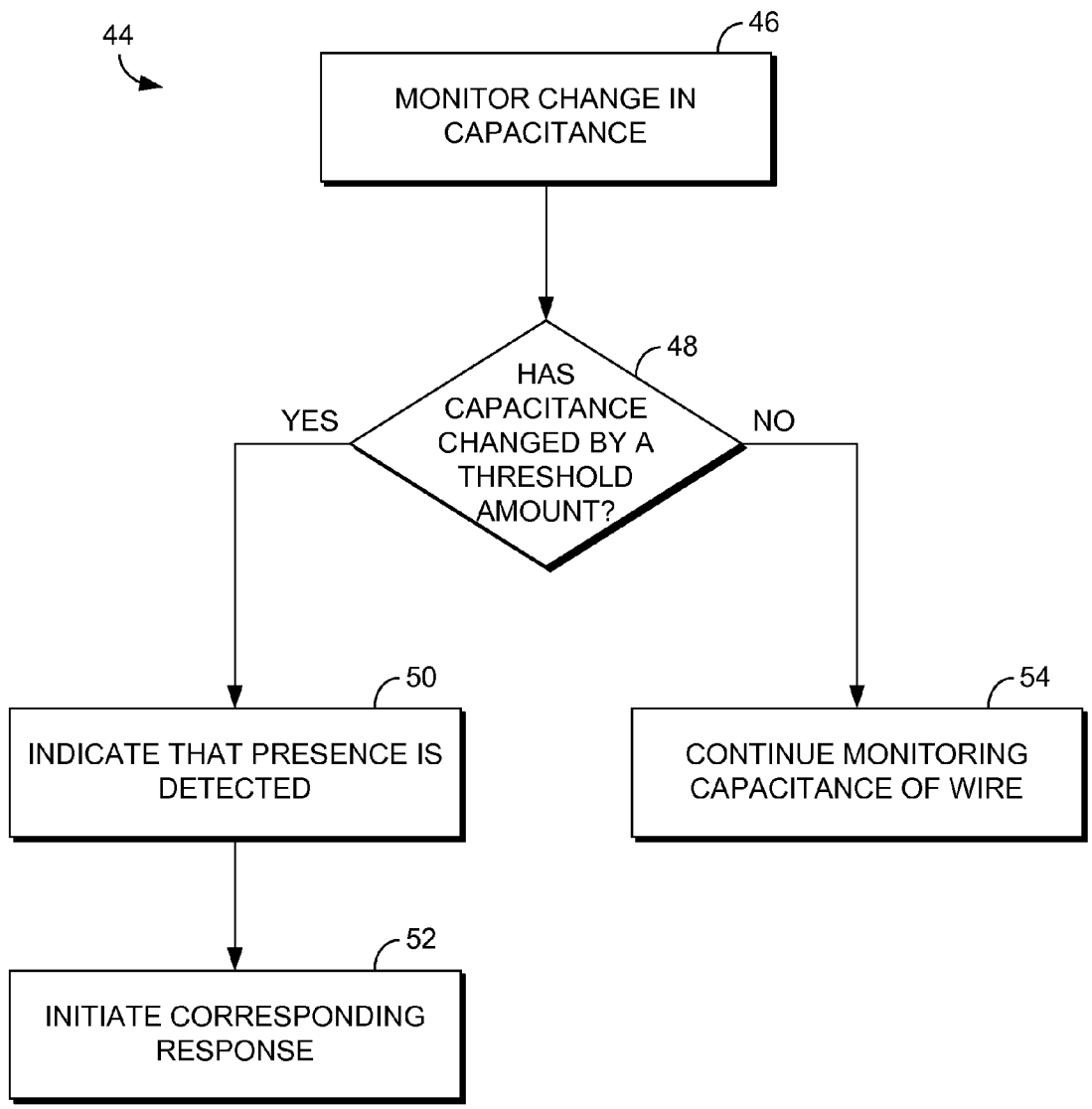
FIG. 9 is a flow diagram of an exemplary method of detecting presence with respect to a bed, in accordance with embodiments of the invention.

Turning now to FIG. 9, an exemplary flow diagram 44 depicts monitoring capacitance and making a determination of presence with respect to a furniture item. At block 46, an average change in capacitance is monitored using a capacitive wire. As discussed above, the change in capacitance indicates a change in voltage over a particular amount of time. At block 48, a determination is made regarding whether the capacitance has changed by a threshold amount. If a determination is made that the capacitance has changed by a threshold amount (i.e. a particular amount of change in voltage has occurred within a particular window of time), then an indication is made that presence has been detected at block 50, and the corresponding response is initiated at block 52. As will be understood, blocks 50 and 52 may, in some embodiments, be combined into a single step of initiation of the corresponding response based on a determination of presence detection. At block 54, if capacitance has not changed by a threshold amount, capacitance monitoring continues.

Figure 10:
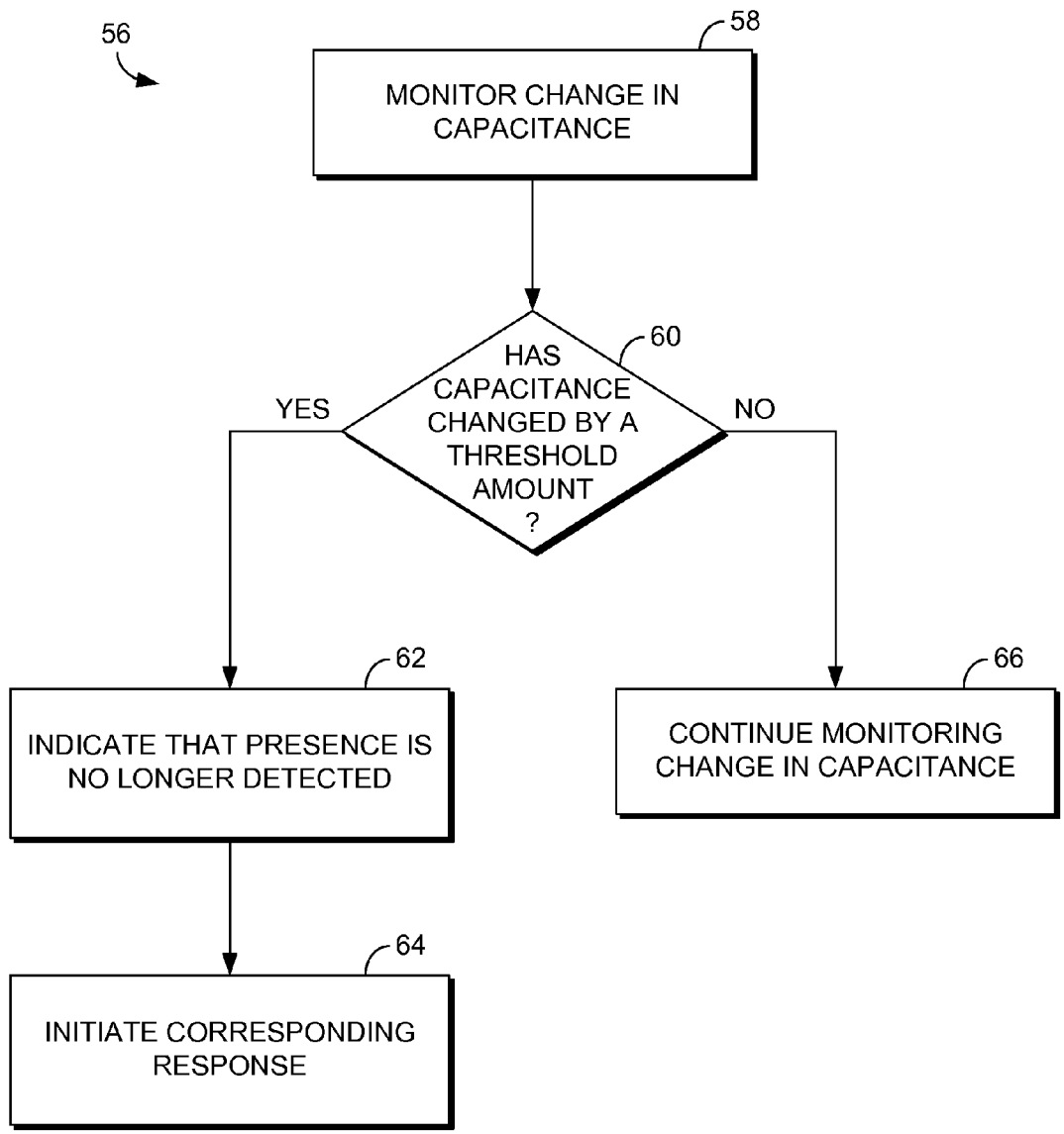
FIG. 10 is a flow diagram of an exemplary method of detecting presence with respect to a bed, in accordance with embodiments of the invention.

With reference next to FIG. 10, an exemplary flow diagram 56 depicts monitoring capacitance and making a determination that presence is no longer detected with respect to a furniture item. At block 58, an average change in capacitance is monitored using a capacitive wire. At block 60, a determination is made whether capacitance has changed by a threshold amount. At block 62, if capacitance has changed by a threshold amount, an indication that presence is no longer detected is made at block 62, and a corresponding response is initiated at block 64. At block 66, if it is determined that the threshold amount has not been satisfied, capacitance monitoring continues.

Figures 11, 12:
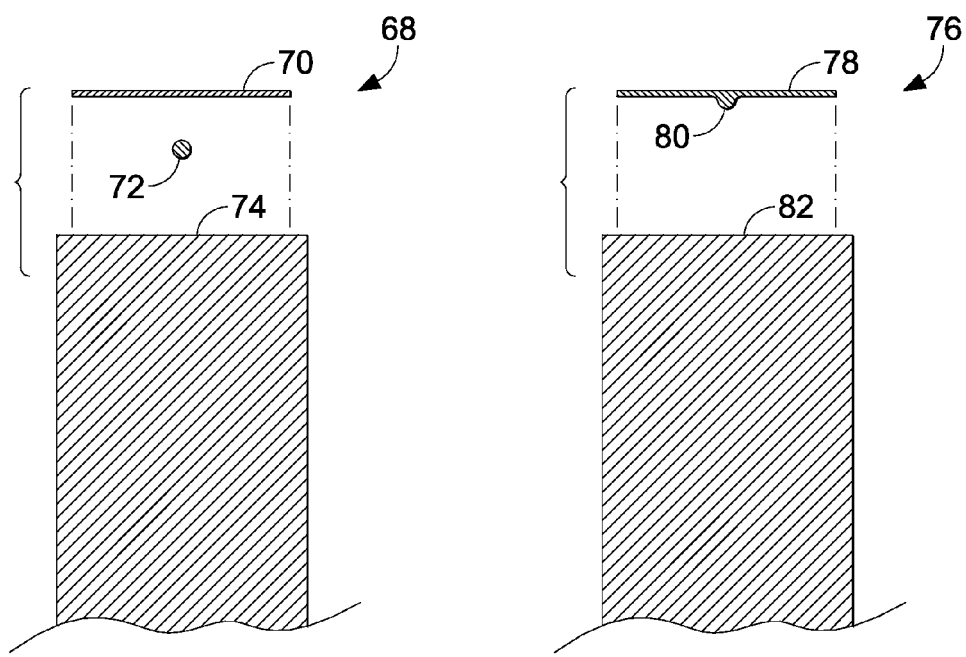
FIG. 11 is a side view of foil tape and capacitive wire for application to a substrate, in accordance with embodiments of the invention.
FIG. 12 is a side view of foil tape having an embedded capacitive wire for application to a substrate; in accordance with embodiments of the invention.

Referring now to FIG. 11, an exemplary capacitive sensing system 68 includes a thin-gauge foil tape 70, a thin-gauge capacitive wire 72, and a substrate 74. In embodiments, foil tape 70 attaches capacitive wire 72 to a substrate 74, such as a perimeter of an item of motion furniture or an adjustable bed. FIG. 12 depicts another exemplary capacitive sensing system 76, with a thin-gauge foil tape 78 having a thin-gauge, capacitive embedded wire 80, for attaching to a substrate 82. For example, a thin-gauge foil tape 78 embedded with a capacitive embedded wire 80 may be held to a substrate 82, such as an adjustable bed. In embodiments, capacitive wire 72 and/or capacitive embedded wire 80 may be coupled to substrates 74 and 82 using an adhesive portion of foil tape 70 and 78. Additionally, foil tapes 70 and 78 may be pressure sensitive adhesive (PSA) foil tapes, for attaching to substrates 74 and 82. In further embodiments, thin-gauge foil tape 70 and 78 are used to attach capacitive wire 72 and/or capacitive embedded wire 80, to a substrate. In addition or in alternative to attaching capacitive wire 72 or capacitive embedded wire 80 using foil tape, such capacitive wiring systems may be coupled to a substrate using staples, glue, adhesive, or otherwise fastened to a number of surfaces to create a capacitive circuit on the adjustable bed or motion furniture item.

Figure 13:
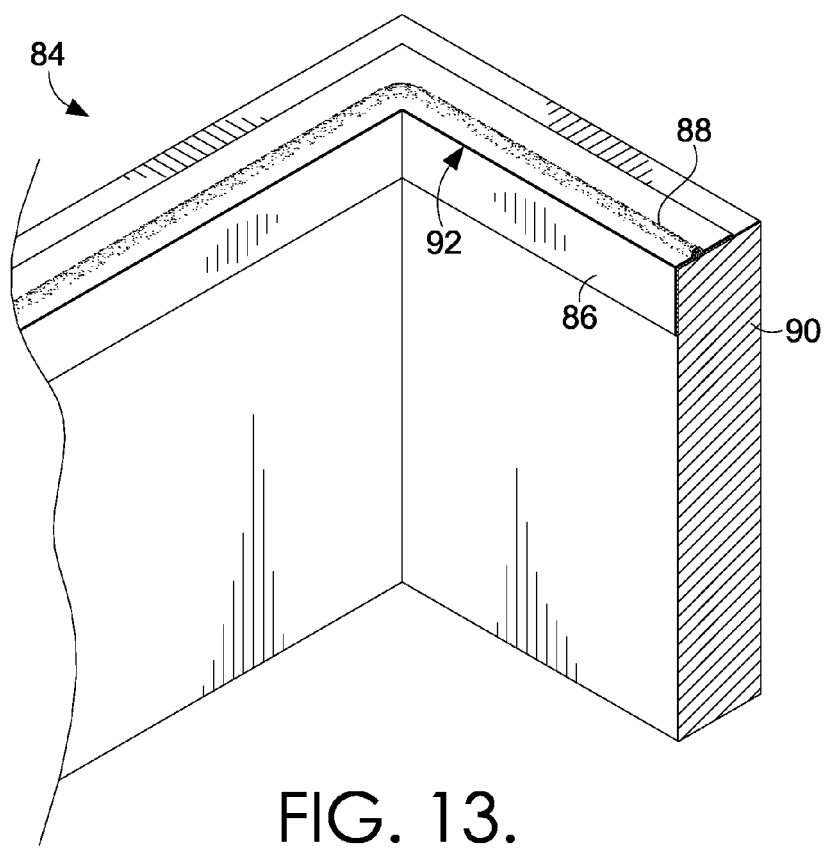
FIG. 13 is a perspective view of a foil tape having an embedded capacitive wire, applied to an edge of a substrate, in accordance with embodiments of the invention.

In the example of FIG. 13, a capacitive sensing system 84 includes a thin-gauge foil tape 86 with an embedded wire 88 coupled to a substrate 90. In particular, the foil tape 86 is applied to an inner edge 92 of substrate 90, such as an inner edge of an adjustable bed frame. In embodiments, foil tape 86 is a PSA tape that is adapted to adhere to a surface of substrate 90, while permitting the foil tape 86 (and the embedded wire 88) to maintain a charge during monitoring of capacitance. For example, foil tape 86 may be coupled to a controller and monitored using a software application that analyzes changes in capacitance, as detected via the foil tape 86 and the embedded wire 88. For example, foil tape 86 may be coupled to a controller (such as a microcontroller) associated with a software application, and used to capacitively detect mammalian touch in components such as doors, windows, furniture, or other items of moveable furniture, such as an adjustable bed. In embodiments, foil tape 86 is capacitive, and is coupled to the embedded wire 88 that is electrically coupled to the microcontroller.

Figure 14:
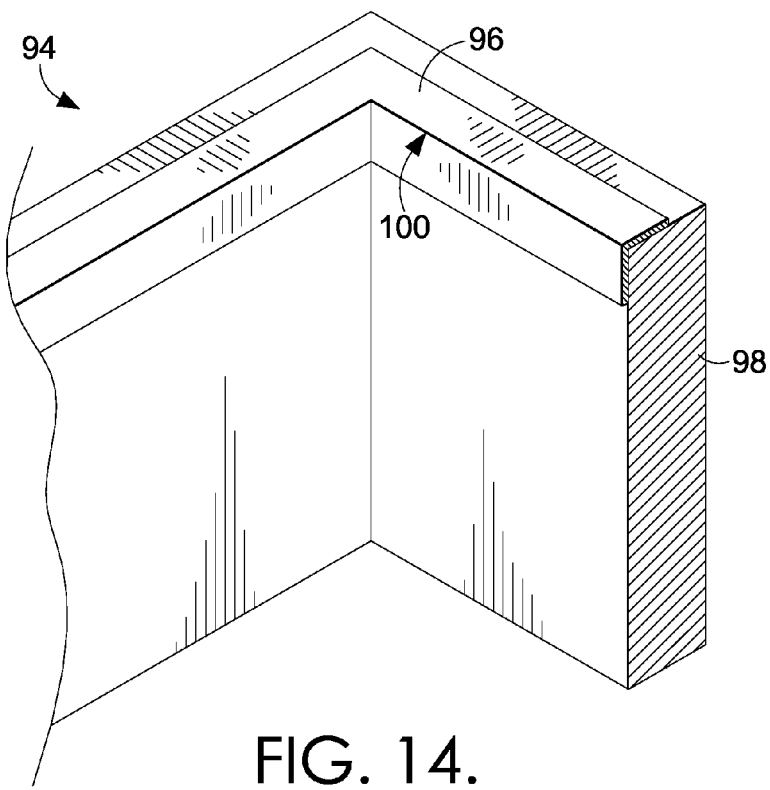
FIG. 14 is a perspective view of a foil tape applied to an edge of a substrate, in accordance with embodiments of the invention.
Figure 15:
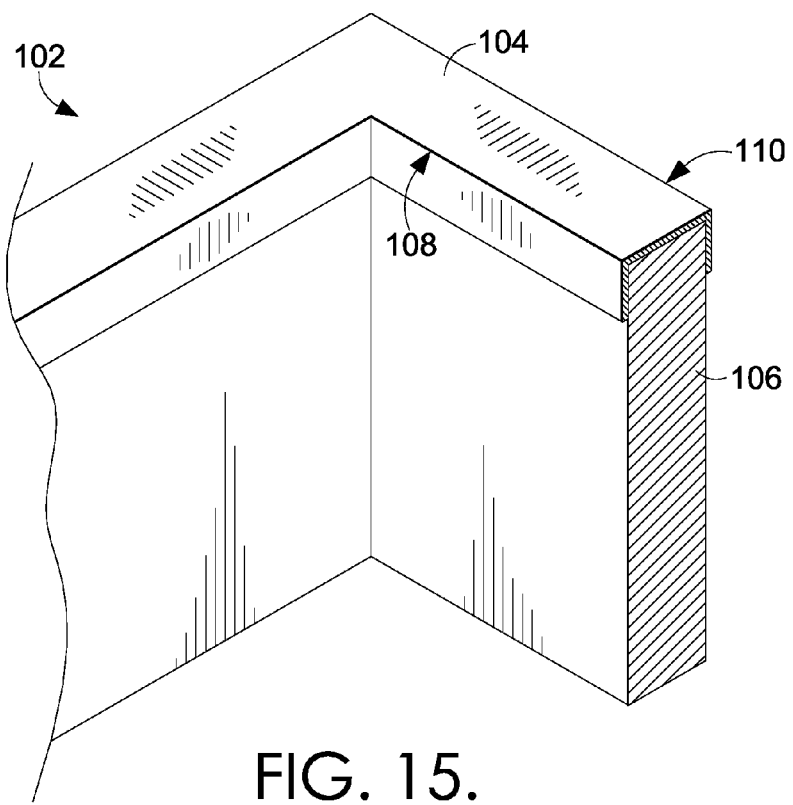
FIG. 15 is a perspective view of a foil tape applied to multiple edges of a substrate, in accordance with embodiments of the invention.

In FIG. 14, a capacitive sensing system 94 includes a capacitive cap 96 coupled to a substrate 98 along an inner edge 100. In embodiments, substrate 98 may be a frame and/or base of an adjustable bed, with an inner edge 100, on which capacitive cap 96 is applied and used for capacitive detection. In one embodiment, capacitive cap 96 is a sensing material, such as a metalized tape, that is able to detect changes in capacitance, and can be placed under or on top of fabrics. Similarly, with reference to FIG. 15, capacitive sensing system 102 depicts a capacitive cap 104 coupled to the top of substrate 106. In particular, capacitive cap 104 is applied along inner edge 108 and outer edge 110. In one embodiment, capacitive cap 104 is a foil and/or metalized tape that can detect a change in capacitance. In further embodiments, substrate 106 may be a frame and/or base of an adjustable bed, with the inner edge 108 and outer edge 110, on which capacitive cap 104 may be used to detect presence based on a change in capacitance detected by the capacitive cap 104. In some embodiments, capacitive cap 96 and/or capacitive cap 104 may be a metallic coated plastic trim that can be used as a sensing material, in addition to or in alternative to a conductive wire and/or foil tape. In further embodiments, capacitive caps 96 and 104 may be made from other ferrous or metallic shapes, such as angles, zees, tees, caps, etc. As such, in embodiments using foil tape for capacitive detection, additional metallic materials could be used to provide capacitive detection of presence with respect to an adjustable bed.

In embodiments, a thin-gauge perimeter wire may be installed around a perimeter of an adjustable bed and/or frame of an adjustable bed. In embodiments, the thin-gauge perimeter wire may be coupled to the base of an adjustable bed using tape; adhesives; fasteners; staples; or may be embedded or extruded through foam; covered in a thin foil tape; or attached via one or more additional/alternative hardware mechanisms. In one embodiment, the perimeter wire may be embedded in foil tape prior to application to the bedding device, as in the example of FIGS. 12-13. In a further embodiment, the perimeter wire may be connected to a coaxial cable using sockets, such as using an RCA jack and socket, or a mechanism such as a Molex® or an Amp connector.

In embodiments, the foil tape and the perimeter wire are capacitively coupled and sensitive to touch. That is, similar to the capacitive wire segments used to detect presence or absence of a person or other being on top of an automated bedding system, foil tape and a perimeter wire coupled to a frame or base of an adjustable bed may also be capacitively coupled and able to detect presence or absence based on a detected change in capacitance. Further, such capacitance detection may be adjusted to a required amount of sensitivity for presence detection, such as "fine tuning" the microcontroller and/or software for detection using thicker upholstery.

In a further embodiment of the invention, ports, grommets, and/or sockets are added to an automated bedding mattress construction to allow connection of a capacitive wire to spring an assembly, thereby creating a capacitive array internal to the mattress. As discussed with reference to FIG. 8, capacitive wire may be incorporated into one or more inner springs of a mattress. Further, in one example, a perimeter wire coupled to an automated bed frame may also be coupled to the inner spring of a mattress assembly to create a capacitive array that detects presence with relation to both the mattress and the frame. In some embodiments, a wire mesh, such as netting and/or a screen, may be capacitively connected to a capacitive sensing system for detection associated with the same perimeter wire.

In some embodiments, body capacitance can be used to operate different types of switches as a capacitive touch sensor will respond to close-proximity detection of a change in capacitance. Accordingly, the tip of a finger may be detected by a capacitive sensor, with a minimal amount of pressure (i.e., triggered without forceful touching), and the capacitive sensing system of an automated furniture item may detect minimal amounts of bodily contact.

Figure 16:
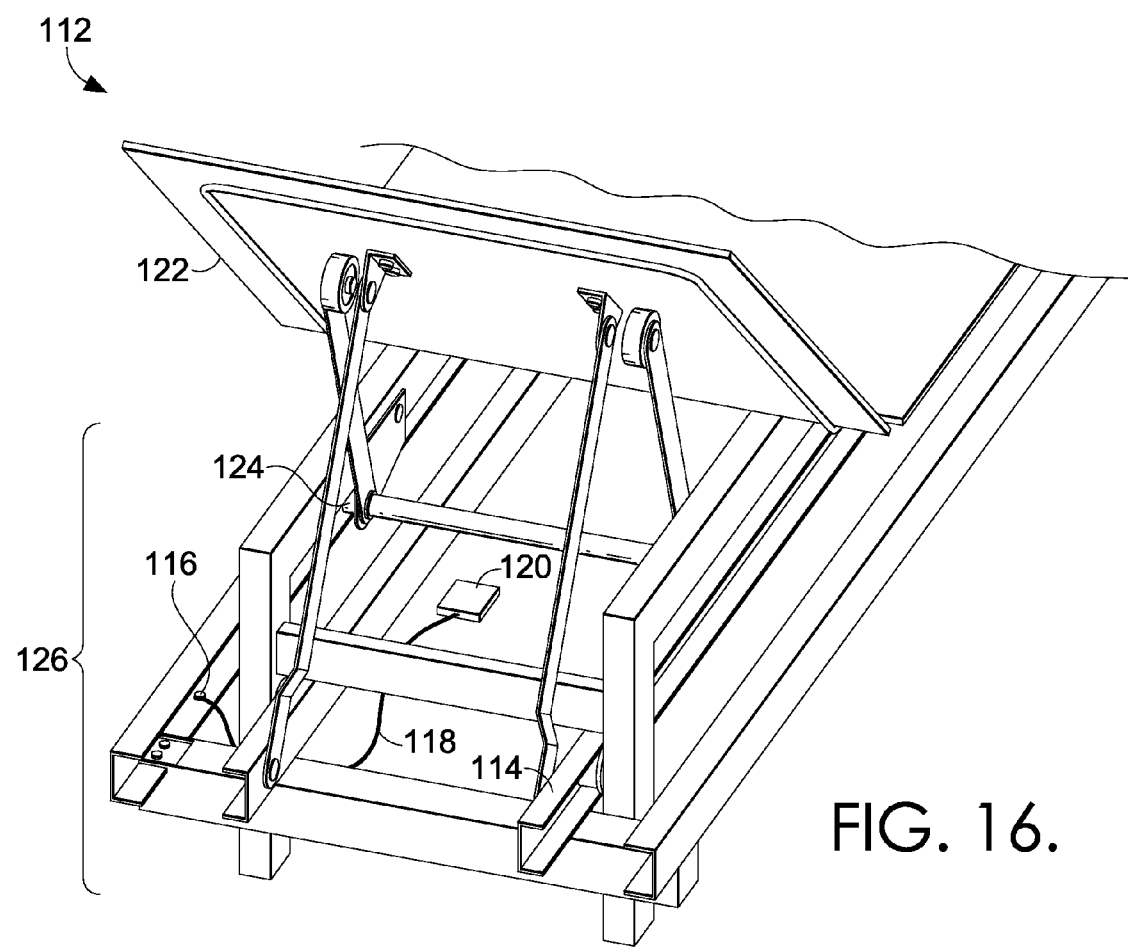
FIG. 16 is a rear perspective view of an adjustable bed, in accordance with embodiments of the invention.

Turning next to FIG. 16, a rear-perspective view of an adjustable bed 112 includes a metal, adjustable bed frame 114 coupled at a contact point 116 to a coaxial cable (coax) 118 and a controller 120. As a portion of the adjustable bed 122 is in motion, presence near the frame 114 of the adjustable bed 122 may be detected by the controller 120, based on the capacitance monitored via bed frame 114. Accordingly, the metal, adjustable bed frame 114 is used as a sensor, with the metal being a conductive material adapted to carry a charge. In embodiments, multiple metal components 126 are coupled together to form the adjustable bed frame 114. Many of these parts are coupled together at joints 124 that are also adapted to carry a charge, which enables the controller 120 to detect presence with respect to contact with any conductive portion of the adjustable bed frame 114. As will be understood, embodiments discussed with reference to FIG. 16 may also be implemented in additional moveable furniture items, such as chairs.

In one embodiment, when a person contacts the adjustable bed frame 114, the frame's normal capacitance is increased. In response to the increase in capacitance by contact with the bed frame 114, the controller 120 measures the change in capacitance of the bed frame 114 against a known capacitance of the frame. In embodiments, controller 120 may be mounted to the bed frame 114 directly, with a separate microcontroller for a sensor, and a separate microcontroller for controlling the bed motion. Accordingly, a sensing microcontroller may use separate channels for wire detection of presence (discussed above) and frame detection of presence. In embodiments, the use of a coax 118 to directly connect the bed frame 114 to the controller 120 reduces the amount of interference caused during monitoring and/or detection, as the coax exits the controller 120 and will not detect any signals until it reaches the bed frame 114.

In one example, as connected to the bed frame 114 via coax 118, controller 120 measures capacitance by pulsing the bed frame 114 with a voltage, such as a low voltage having a minimal amount of current. In between pulses from the controller 120, the signal fed into the controller's analog to digital converter (ADC) is used to measure how much the voltage changes over time. In one embodiment, one microcontroller of the controller 120 may send out a charge, with the resulting charge being read by another microcontroller having a processor that monitors how quickly the detected charge decays. In one embodiment, when a body is in contact with the frame, the controller 120 monitors how quickly the change in capacitance rises, and how far the change in capacitance rises.

Based on detection of a change in capacitance by the controller 120, the actuator of the adjustable bed frame 114 may be disabled during a motion operation if it is determined that human contact is detected. In embodiments, the controller 120 may monitor the overall levels of capacitance of the bed frame 114 to determine what changes in capacitance do and do not satisfy a threshold for determining that contact has been made. For example, the rate of change and the amount of change may be monitored to determine whether a threshold for contact has been met, and whether the travel of the bed frame 114 should be altered. In embodiments, when triggered by a controller 120, the actuators of an adjustable bed 112 may be programmed to stop all motion (such as downward motion) when contact is detected by the conductive, metal bed frame 114. In such an example, when presence of a human is detected underneath a moving, adjustable bed 112, the detection by bed frame 114 may indicate to the controller 120 to discontinue travel of the bed frame 114. In another embodiment, in response to detection of a human underneath a moving, adjustable bed 114, the actuators may reverse and/or retract motion by a particular distance, such as backing up an inch if the bed frame 114 was lowering to a downward position when presence was detected.

Accordingly, to re-start travel once a condition has been met for stopping travel by the controller 120, a user may indicate to the adjustable bed 112 that 1) the condition that triggered the indication of presence has gone away, and/or 2) that the user has again selected motion of the adjustable bed frame 114 by providing an indication to the controller 120 (such as pushing a button on a controller of the adjustable bed 112). In further embodiments, controller 120 may track the usage of an adjustable bed 112, and the subsequent commands received after detecting presence near a moving bed frame 114. Such tracking may be used to designate specific actions required by the bed in response to presence detection, such as moving of a bed into a fully-upright position, or discontinuing motion of the bed prior to initiating a subsequent lowering once presence is no longer detected.

Figures 17A, 17B, 17C:
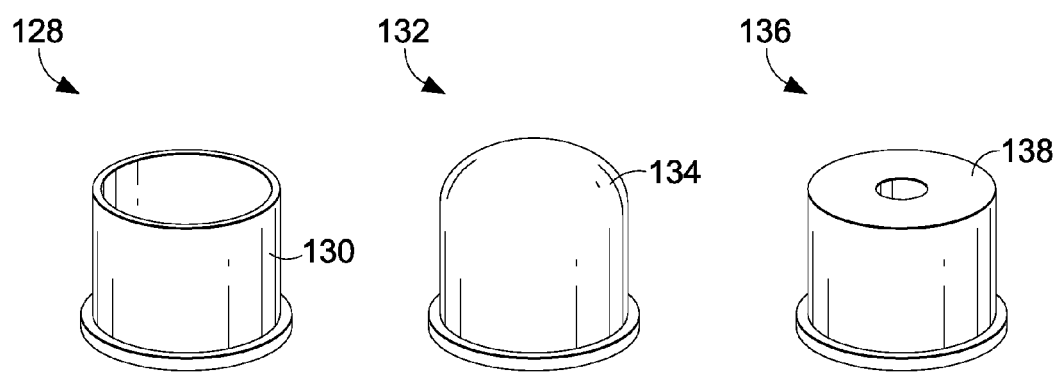
FIG. 17A is a conductive bushing, in accordance with embodiments of the invention.
FIG. 17B is a conductive encapsulating torque tube, in accordance with embodiments of the invention.
FIG. 17C is a conductive bushing, in accordance with embodiments of the invention.

With reference to FIG. 17A, an exemplary metallic bushing 128, such as conductive bushing 130, may be used to provide an acceptable transfer of energy within a metal assembly, such as the metal, adjustable bed frame 114 of FIG. 16. For example, one or more parts of an adjustable bed frame 114 may be coupled together at joints 124 that use conductive bushing 130 to carry a charge, thereby enabling a controller 120 to detect presence with respect to contact with any conductive portion of the adjustable bed frame 114. Additional embodiments of metallic bushings 132 and 136 are depicted in FIGS. 17B and 17C. FIG. 17B depicts an exemplary, conductive encapsulating torque tube 134, while FIG. 17C depicts an exemplary, conductive bushing 138 for use with capacitive detection associated with a metallic assembly. Accordingly, in some embodiments, conductive bushings are made using conductive materials to create "conductive" plastics, such as using stainless steel, carbon fibers, carbon black, carbon powder, graphite, and the like. In another embodiment, conductive bushings are made using chemical additives or coatings added to plastic bushings to increase the conductivity. In further embodiments, a metal coating on the outside of a bushing, or a metal coating encapsulated inside a plastic bushing, may be used to generate conductive bushings. As will be understood, a number of metallic, conductive, and/or chemical additives, treatments or materials may be used to create conductive bushings for use in a metallic assembly that carries a charge and is used to detect capacitance, such as a metallic, adjustable bed frame 114.

As will be understood, "traditional" bushings used in adjustable beds or motion furniture are often made with electrically-insulating acetals, which prevent the transfer of a charge during detection of capacitance. Accordingly, in some embodiments, parasitic capacitive coupling may be used to capacitively couple components of the adjustable bed or motion furniture metallic assemblies. In a further embodiment, jumper wires are used to connect components of an adjustable bed that are electrically isolated due to non-conductive bushings. For example, electrically-isolated parts of a metal, adjustable bed frame may be coupled to other conductive portions of the bed frame using jumper wires.

In embodiments, bushings and other washer materials being carbon-fiber filled acetal with moderate surface conductivity may be used. Such bushings and washers may assist in the transfer of energy throughout a metal, adjustable bed frame 114, its components, and related assemblies. In some embodiments, a metallic bed frame may be capacitively coupled to other assemblies in the adjustable base. Accordingly, the term "metallic assembly" may be used to refer to any of the frame, components of the frame, and assemblies of an adjustable furniture item, such as a bed.

In one embodiment, acetal carbon-fiber filled bushings are less than or equal to the surface resistivity of 1.0E+3 ohm and have a volume resistivity of 1.0E+3 ohm centimeter (using test methods per IEC 60093). The human body capacitance is the input to the metallic assembly, and the carbon-fiber filled bushings act as "jumper wires" to transmit energy between the metallic assemblies in adjustable beds and motion furniture. In one embodiment, electroceramics (ceramic materials specifically formulated for electrical properties) may be tailored for use as a highly-conductive bushing material, such as the electronically conductive ceramic consisting of Indium Tin Oxide (ITO), Lamthanum-doped strontium titanate (SLT), and yttrium-doped strontium titanate (SYT).

Figure 18:
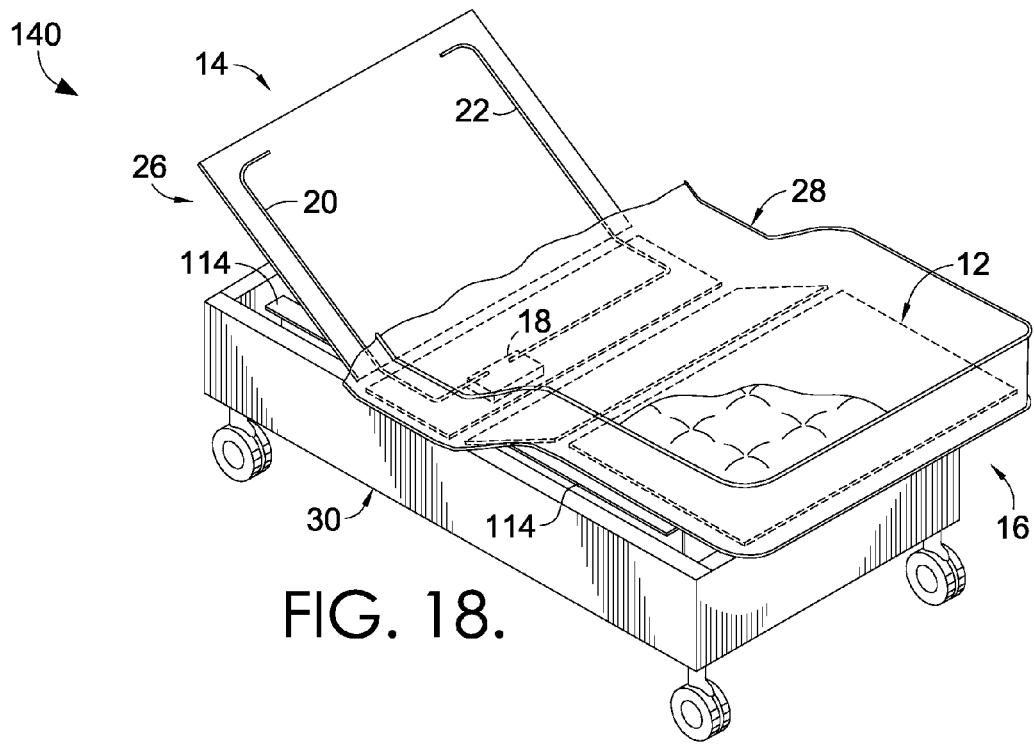
FIG. 18 is a perspective view of an automated bed with head and feet portions of the bed raised to partially reveal a metal, adjustable bed frame, and a portion of the mattress cut away to reveal capacitive wire coupled to the top of the platform, in accordance with embodiments of the invention.

Turning next to FIG. 18, an automated bedding system 140 includes an adjustable bed 26 having a plurality of panels 12 with a first end 14 and a second end 16, a control enclosure 18 (mounted below the plurality of panels 12), a first segment 20 of a capacitive wire, and a second segment 22 of a capacitive wire. In some embodiments, the first end 14 may be referred to as the "head" of the bed, while the second end 16 may be referred to as the "foot" of the bed. In FIG. 18, adjustable bed 26 is depicted in a raised position with the first end 14 raised and the second end 16 raised, to reveal a portion of the metal, adjustable bed frame 114 of the adjustable bed 26. In embodiments, the bed frame 114 is a conductive material used to carry a charge and monitor a change in capacitance, as discussed above. Accordingly, in an example where the first end 14 of the adjustable bed 26 is being lowered, detection of human contact with the bed frame 114 may trigger the bed to discontinue downward motion. In some embodiments, detection of contact with bed frame 114 may also trigger a retracting and/or raising of the first end 14. Similarly, in another embodiment, the lowering of second end 16 may be stopped based on detection of human presence by bed frame 114.

Figure 19:
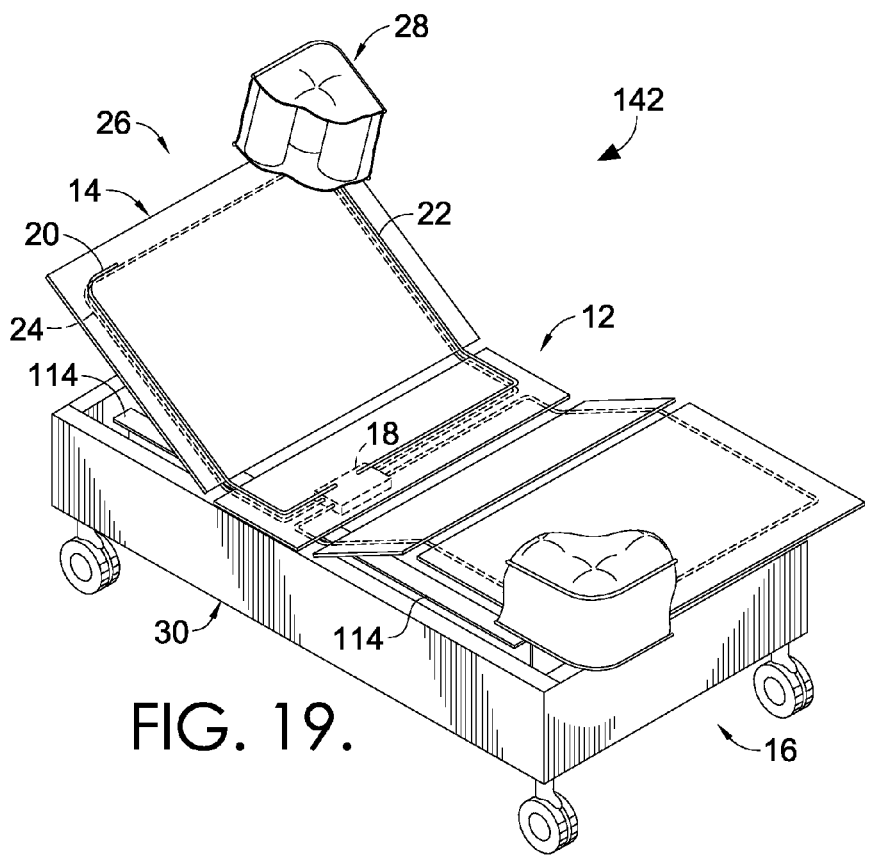
FIG. 19 is a perspective view of the automated bed of FIG. 18, with head and feet portions of the bed raised to partially reveal a metal, adjustable bed frame, and with the mattress cut away to reveal a capacitive wire coupled to the top of the platform and hidden lines indicating the capacitive wire and control enclosure coupled to the bottom of the platform, in accordance with embodiments of the invention.
Figure 20:
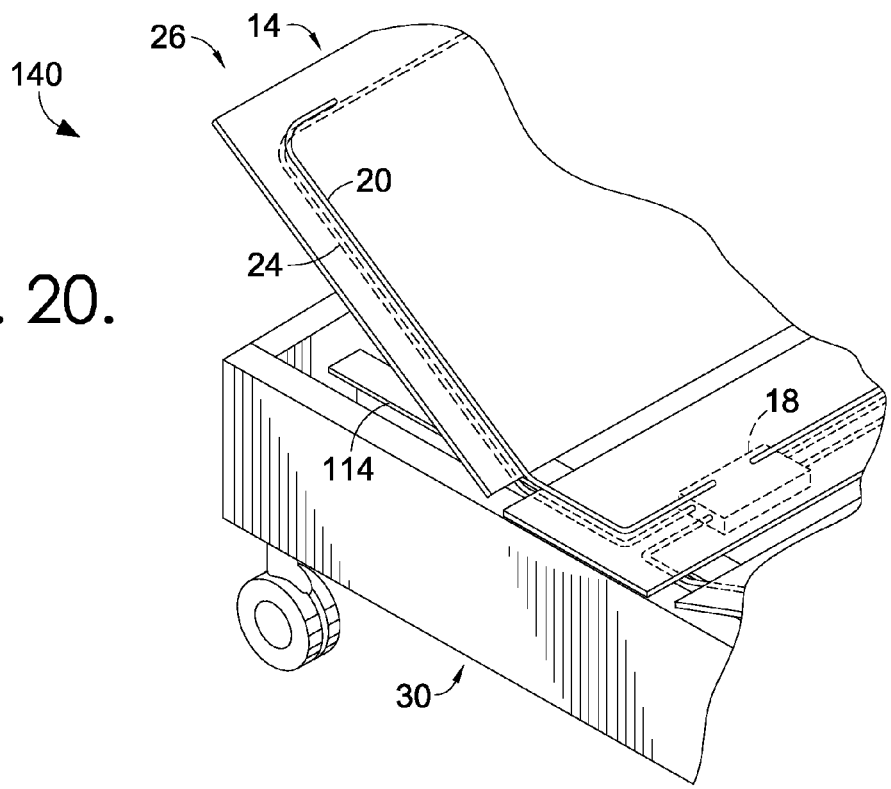
FIG. 20 is an enlarged, perspective view of the automated bed of FIG. 19, with head and feet portions of the bed raised to partially reveal a metal, adjustable bed frame, and with a capacitive wire coupled to the top of the platform and hidden lines indicating the capacitive wire and control enclosure coupled to the bottom of the platform, in accordance with embodiments of the invention.

As can be seen in FIG. 18, capacitive wiring around a perimeter of a platform may be used in addition or alternative to the capacitive detection using bed frame 114. Accordingly, FIG. 19 depicts the adjustable bed of FIG. 18, with a majority of the mattress 28 removed. As can be seen on the plurality of panels 12, first and second segments 20 and 22 of capacitive wire detect presence above the platform (e.g. on top of the mattress), while the third segment 24 detects presence below the platform (e.g. under the bed). An enlarged view of FIG. 19 is shown in FIG. 20, with hidden lines depicting capacitive wires 20 and 24 coupled to the control enclosure 18, which is mounted beneath the panels 12. Further, the metal frame 114 is shown below the mattress 28, and can be used to detect presence, in addition or in alternative to the capacitive wire segments on the platform 12.

Figure 21:
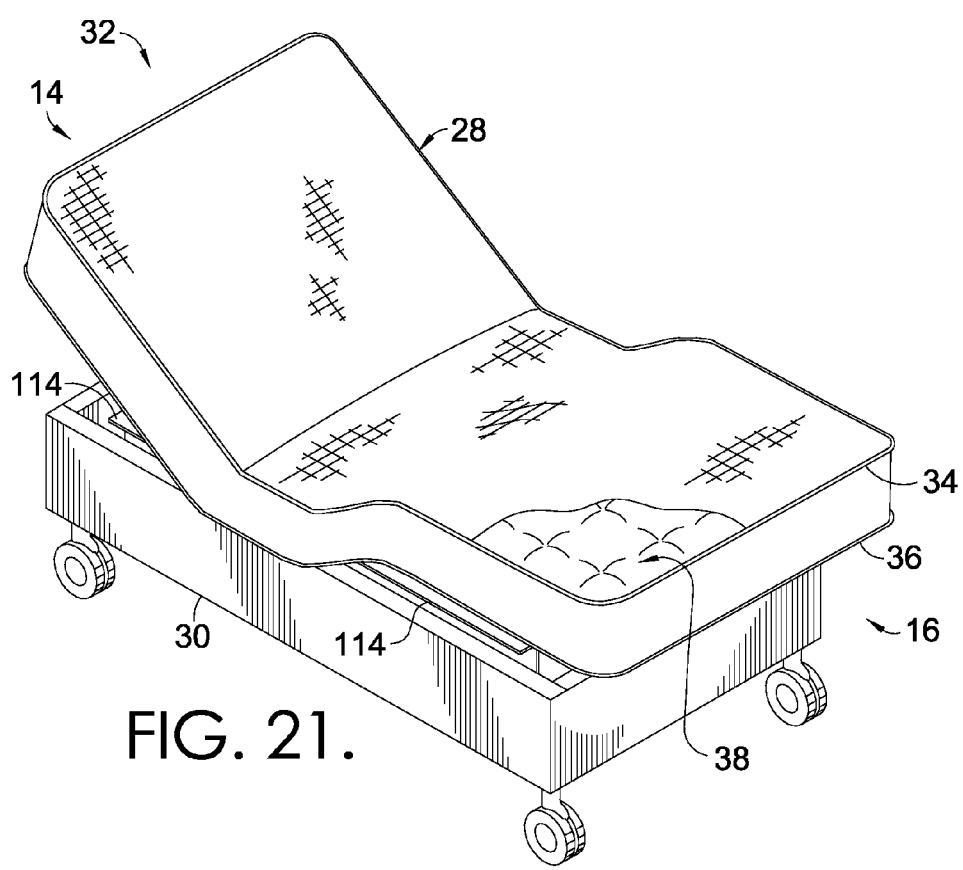
FIG. 21 is a perspective view of an automated bed with head and feet portions of the bed raised to partially reveal a metal, adjustable bed frame, and a tape edge surrounding a perimeter of the mattress cover, in accordance with embodiments of the invention.

With reference to FIG. 21, an enlarged, perspective view of the automated bed of FIG. 19, with head and feet portions of the bed raised to partially reveal a metal, adjustable bed frame 114 is shown. Additionally, in some embodiments, a conductive wire may be incorporated into the top tape edge 34 around the top surface of the mattress 28. In another example, a conductive wire may be incorporated into the bottom tape edge 36 around the bottom surface of the mattress 28. During manufacturing, a conductive wire may be inserted into the tape edge automatically, as the tape edge is applied to a mattress covering. In some embodiments, when routed through the tape edge perimeter, the sensitivity of the conductive wire may be adjusted in software associated with a processor used to determine presence detection. Accordingly, in some embodiments, presence may be detected with respect to an adjustable bed using both wiring incorporated into the perimeter of the mattress, the metal, adjustable bed frame 114 itself being used as a capacitive sensor.

Figure 22:
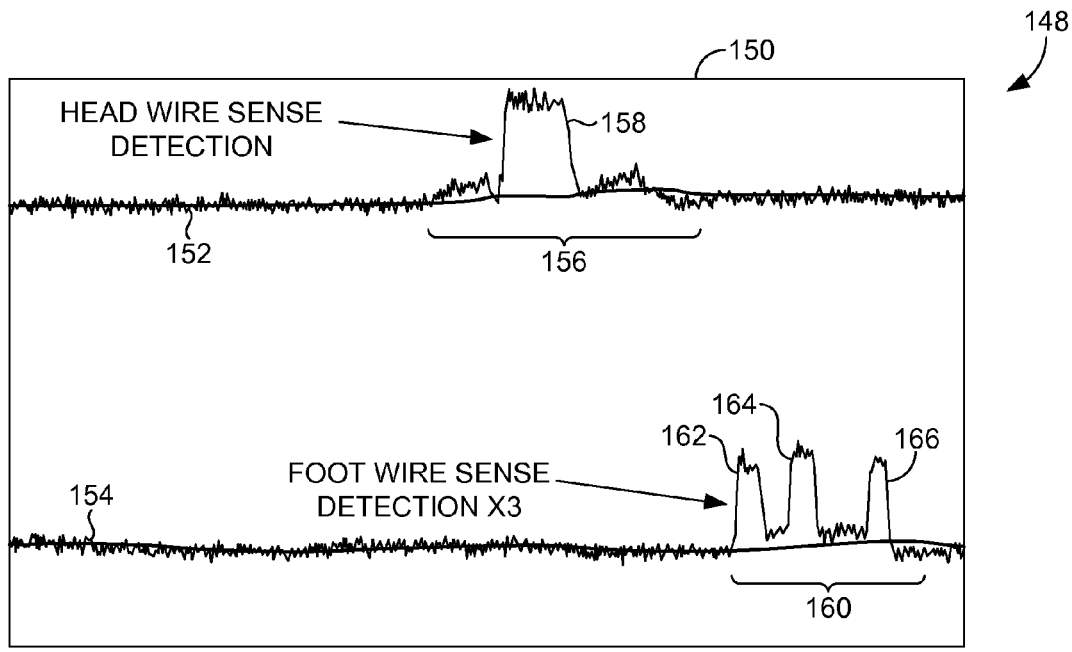
FIG. 22 is an exemplary graphical display of the measure of head wire sense detection and foot wire sense detection associated with an adjustable bed, using capacitance monitoring, in accordance with embodiments of the invention.
Figure 23:
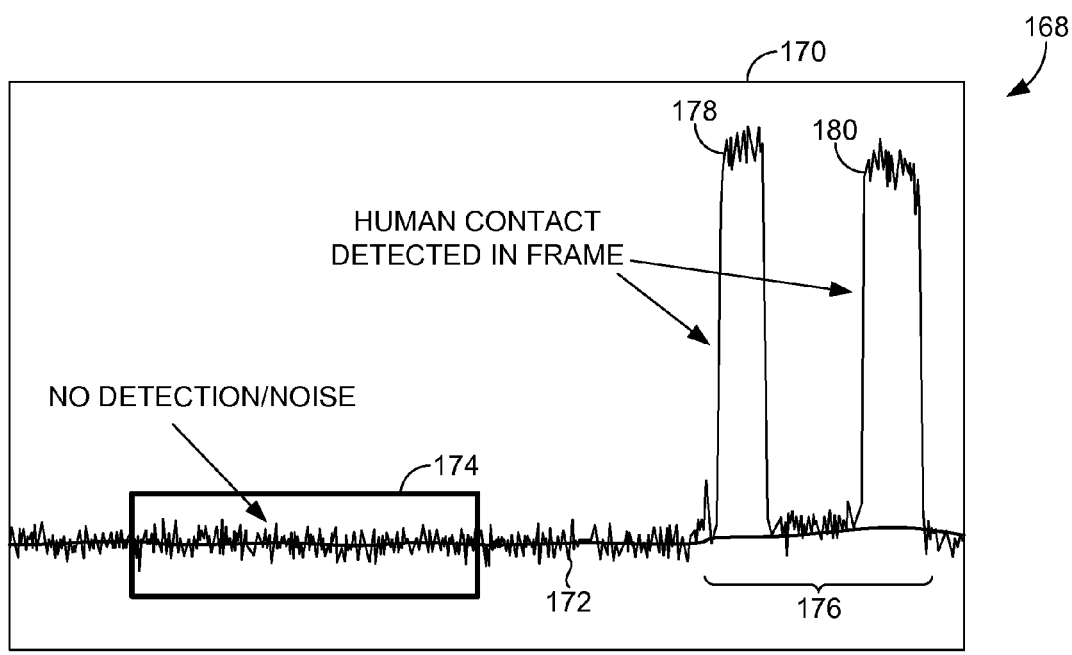
FIG. 23 is an exemplary graphical display of the measure of contact detection with a metal, adjustable bed frame using capacitance monitoring, in accordance with embodiments of the invention.
Figure 24:
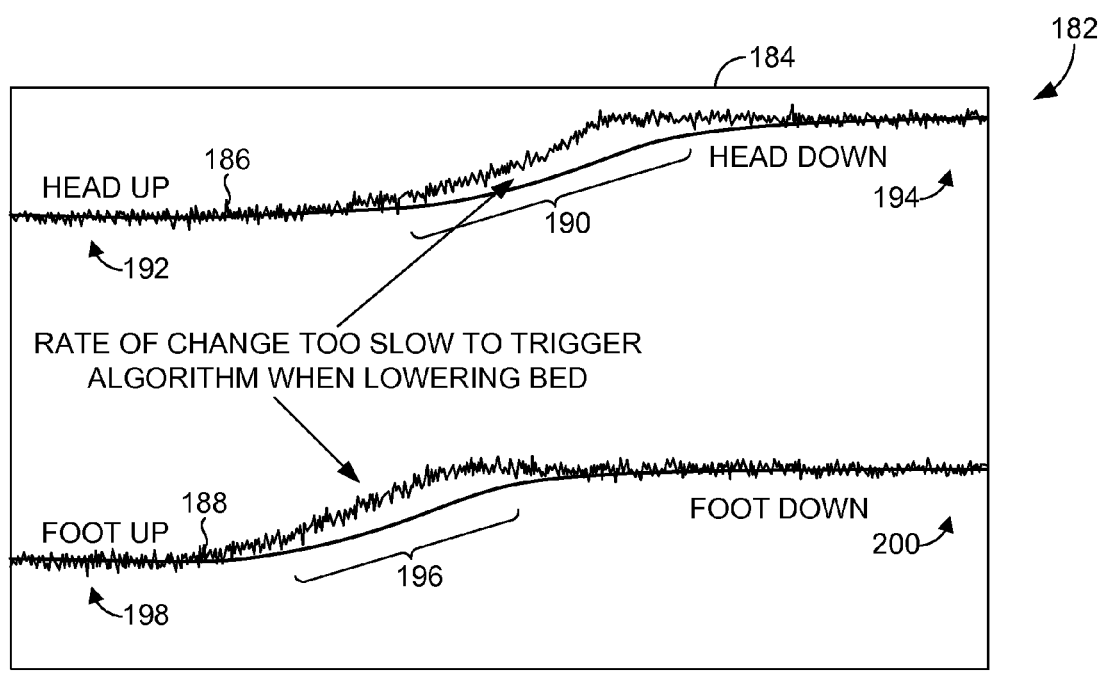
FIG. 24 is an exemplary graphical display of the measure of the rate of change of monitored capacitance during lowering of the head portion and foot portion of a metal, adjustable bed frame, in accordance with embodiments of the invention.

With reference to FIGS. 22-24, capacitive detection is monitored over time, noting changes in capacitance due to presence detection, noise interference, and movement of the automated bed. For example, in FIG. 22, capacitance detection 148 is shown on a display 150 that includes both head wire monitoring 152 and foot wire monitoring 154. As shown along the path of the head wire monitoring 152, head wire sense detection area 156 indicates a peak 158 of change in capacitance. Similarly, along the path of the foot wire sense monitoring 154, foot wire sense detection area 160 indicates three peaks 162, 164, and 166, that indicate changes in capacitance. Accordingly, in one embodiment, a capacitive wire near a first end 14 (head) of an adjustable bed may detect a change capacitance (such as peak 158) that triggers one or more features of the adjustable bed. In another embodiment, a capacitive wire near a second end 16 (foot) of an adjustable bed may detect a change in capacitance (such as one or more of the peaks 162, 164 and 166) and be used to trigger one or more features of an adjustable bed. In some embodiments, triggering a feature of an adjustable bed requires satisfying a threshold for detection. In other words, the monitoring system may detect changes in capacitance in relation to the head or foot portions of the bed, but the change in capacitance may not be great enough to satisfy a threshold for detection that triggers a feature. For example, minimal movement of a person on a mattress may indicate some level of change in capacitance to the monitoring system, without triggering any change in movement of the bed or activity of associated features. Meanwhile, complete removal of user from a bed, which alters the detected capacitance above a particular threshold may indeed trigger the threshold for an associated activity, such as lowering the foot of the bed and/or triggering lights to come on.

Turning next to FIG. 23, capacitance detection 168 is shown on a display 170 that includes monitoring of capacitance 172 of a metal, adjustable bed frame. Detection area 174 designates the indication of no presence being detected, and also provides an indication of the inherent level of noise that is detected by the system. Further, detection area 176 indicates peaks 178 and 180 of changes in capacitance, which exhibit that human contact with the bed frame has been detected. As discussed above, a threshold for detection may be determined, such that a minimal amount of contact, for a short period of time, may not trigger an indication of presence with respect to the bed frame. At the same time, contact with the bed frame for a longer period of time, as indicated by a large change in capacitance for a longer duration, may be associated with a determination of presence under and/or near the bed frame. In embodiments, detection of human contact with the frame, as indicated by peaks 178 and 180, may trigger a number of features associated with the adjustable bed, such as stopping of a lowering feature, alerting of an alarm feature, retracting of motion in an upward direction for a specified distance, or any combination of features programmed to activate in response to the appropriate trigger.

With reference finally to FIG. 24, capacitance detection 182 is shown on display 184 to demonstrate the amount of change in capacitance over time with respect to the frame of an adjustable bed, such as the adjustable bed frame monitored in FIG. 23. Display 184 includes the monitoring of a head portion 186 and a foot portion 188 of an adjustable bed. In embodiments, the rate of change area 190 is monitored as the capacitance changes from a first level of capacitance 192 to a second level of capacitance 194. Similarly, rate of change area 196 is monitored as the capacitance changes from a first level of capacitance 198 to a second level of capacitance 200. In embodiments, the rate of change in capacitance impacts whether the change itself triggers any feature of the automated bed. Accordingly, as indicated on the display 184, the rate of change area 190 and the rate of change area 196 indicate to a processor and/or controller that the rate of change in capacitance is occurring over too long of a time (i.e., is too slow) to trigger any of the features of the adjustable bed associated with lowering of the bed. For example, an algorithm that requires a minimum amount of change in capacitance before stopping lowering a bed (i.e. an algorithm that requires detection of the presence of human contact) may not be triggered by the change in capacitance caused by the movement of the bed itself, such as in FIG. 24.

As will be understood, a variety of filtering techniques may be used to adjust the determinations made (regarding whether presence is or is not detected) using software associated with the processor. For example, a variety of filters or transforms may be applied to the monitored capacitance signal to adjust/adapt the software for a particular application or user. For example, an automated bedding system could be adapted to adjust lighting or other functions based on particular amounts of change in capacitance over particular amounts of time, or trigger particular functions during particular times of day/night. As such, a processor may be trained to alter the sensitivity of a threshold based on previous use by a particular user of a corresponding feature. Additionally, a reaction time may be changed and a threshold may be adjusted for different users and different features of the automated bed.

From the foregoing, it will be seen that this invention is one well adapted to attain all the ends and objects hereinabove set forth together with other advantages, which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

The invention claimed is:

1. An adjustable bed, comprising:
   a mattress support that comprises a plurality of support panels, at least one of said support panels movable relative to the other ones of said support panels to thereby adjust the bed from a first position to a second position;
a metal bed frame coupled to the plurality of support panels, said metal bed frame comprising a plurality of metal components and a plurality of conductive bushings;
a mattress resting on top of the mattress support, said mattress having a covering material disposed over at least a top surface of the mattress;
at least one capacitive component coupled to the bed, said at least one capacitive component separate from the mattress, wherein the at least one capacitive component is adapted to have a voltage based on proximity of an object to the at least one capacitive component, and further wherein the at least one capacitive component comprises the metal bed frame associated with the adjustable bed and below the mattress support, wherein the at least one capacitive component is configured to determine presence in proximity to an area below the mattress support based on detecting a change in voltage associated with the metal bed frame; and
a processor coupled to the at least one capacitive component, the processor adapted to receive frame detection information provided by the at least one capacitive component and to determine that a change in voltage satisfies a threshold,
wherein the change in voltage due to the change in capacitance of the at least one capacitive component as the support panels move to adjust the bed from the first position to the second position does not satisfy the threshold.

2. The bed of claim 1, wherein the metal bed frame is coupled to the processor with at least one coaxial cable.

3. The bed of claim 2, wherein the processor receives information directly from the at least one capacitive component.

4. The bed of claim 1, wherein receiving information provided by the at least one capacitive component comprises pulsing the metal bed frame with a voltage to provide a charge to the metal bed frame.

5. The bed of claim 4, wherein an analog to digital (ADC) converter is used to measure how the charge of the metal bed frame changes over time.

6. The bed of claim 1, wherein determining that a change in voltage satisfies a threshold comprises:
monitoring a change in voltage detected by the at least one capacitive component over a particular period of time; and
comparing the change in voltage over the period of time with the threshold,
wherein the change in voltage exceeds the threshold for a threshold period of time.

7. The bed of claim 6, wherein, based on determining that a change in voltage satisfies a threshold, the processor is adapted to discontinue motion of the adjustable bed until it is determined that a change in voltage no longer satisfies the threshold.

8. The bed of claim 6, wherein, based on determining that a change in voltage satisfies a threshold, the processor is adapted to discontinue motion of the adjustable bed until it is determined that an indication to initiate motion is received.

9. A method for detecting presence with respect to an item of furniture, the method comprising:
receiving information provided by at least one capacitive component coupled to the item of furniture, wherein the item of furniture comprises:
(1) a furniture support comprising a plurality of moveable support panels; and
(2) a metal frame coupled to the plurality of moveable support panels, said metal frame comprising a plurality of metal components and at least one conductive bushing;
wherein the at least one capacitive component comprises the metal frame associated with the item of furniture, wherein receiving information from said at least one capacitive component comprises pulsing the metal frame of the item of furniture with a voltage to provide a charge to the metal frame,
and further wherein the at least one capacitive component is adapted to have a voltage based on proximity of an object to the at least one capacitive component, wherein the at least one capacitive component is configured to detect user presence in proximity to an area below the furniture support based on detection of a change in voltage associated with the metal frame;
determining user presence in proximity to the area below the furniture support based on determining that a change in voltage satisfies a threshold, wherein determining that a change in voltage satisfies a threshold comprises:
(1) monitoring a rate of change in voltage detected by the at least one capacitive component; and
(2) comparing the monitored rate of change in voltage with the threshold.

10. The method of claim 9, wherein the at least one conductive bushing is adapted to capacitively couple two or more metal components of the metal frame.

11. The method of claim 10, wherein the at least one conductive bushing comprises at least one material adapted to transfer energy between the two or more metal components, wherein the at least one material comprises one or more of stainless steel, carbon fiber, carbon black, carbon powder, and graphite.

12. The method of claim 10, wherein the at least one conductive bushing comprises at least one plastic bushing having one or more of a chemical additive that increases conductivity and a chemical coating that increases conductivity.

13. The method of claim 10, wherein the at least one conductive bushing comprises at least one metal coating associated with the at least one conductive bushing, wherein the at least one metal coating is applied to one or more of an outside surface of the at least one conductive bushing and an interior surface of the at least one conductive bushing.

14. A method for detecting presence with respect to an adjustable bed, the method comprising:
receiving information provided by at least one capacitive component coupled to a perimeter of a stationary surround of an adjustable bed frame, said capacitive component configured to detect user presence in proximity to an area surrounding the stationary surround, wherein the at least one capacitive component is adapted to have a voltage based on proximity of an object to the at least one capacitive component, and further wherein the at least one capacitive component comprises a foil tape applied to the perimeter of the stationary surround based on coupling to one or more of a substrate inner edge, a substrate top, and a substrate outer edge of the stationary surround;

determining that a change in voltage satisfies a threshold amount for a threshold period of time based on monitoring user presence with respect to at least a portion of the stationary surround; and based on determining that the threshold amount is satisfied for the threshold period of time, initiating a corresponding response.

15. The method of claim 14, wherein the foil tape comprises a thin-gauge foil tape, and further wherein the foil tape is embedded with a conductive material.

16. The method of claim 15, wherein the foil tape is embedded with a capacitive wire.

17. The method of claim 14, wherein a sensitivity of the at least one capacitive component is adjusted such that an amount of change in voltage corresponding to direct contact with at least a portion of the stationary surround is required prior to determining that the change in voltage satisfies a threshold amount.

* * * * *